United States Patent
Wang et al.

(10) Patent No.: US 11,158,830 B2
(45) Date of Patent: Oct. 26, 2021

(54) PEROVSKITE FILM LAYER, DEVICE AND PREPARATION METHOD FOR EFFECTIVELY IMPROVING EFFICIENCY OF LIGHT-EMITTING DEVICE

(71) Applicant: NANJING UNIVERSITY OF TECHNOLOGY, Jiangsu (CN)

(72) Inventors: Jianpu Wang, Jiangsu (CN); Nana Wang, Jiangsu (CN); Yu Cao, Jiangsu (CN); Wei Huang, Jiangsu (CN)

(73) Assignee: NANJING UNIVERSITY OF TECHNOLOGY, Jiangsu (CN)

( * ) Notice: Subject to any disclaimer, the term of this patent is extended or adjusted under 35 U.S.C. 154(b) by 0 days.

(21) Appl. No.: 16/771,230

(22) PCT Filed: Dec. 5, 2018

(86) PCT No.: PCT/CN2018/119317
§ 371 (c)(1),
(2) Date: Jun. 10, 2020

(87) PCT Pub. No.: WO2019/128656
PCT Pub. Date: Jul. 4, 2019

(65) Prior Publication Data
US 2021/0098731 A1    Apr. 1, 2021

(30) Foreign Application Priority Data
Dec. 27, 2017   (CN) .......................... 201711439127.3

(51) Int. Cl.
*H01L 51/50* (2006.01)
*H01L 51/00* (2006.01)
(Continued)

(52) U.S. Cl.
CPC ...... *H01L 51/5012* (2013.01); *H01L 51/0077* (2013.01); *H01L 51/502* (2013.01);
(Continued)

(58) Field of Classification Search
CPC ....... H01L 51/506; H01L 51/56; H01L 51/50; H01L 51/5076
See application file for complete search history.

(56) References Cited

U.S. PATENT DOCUMENTS

2003/0175425 A1* 9/2003 Tatsumi ............ H01L 21/02197
427/255.28

FOREIGN PATENT DOCUMENTS

CN      102621607 A    8/2012
CN      106064831 A   11/2016
(Continued)

OTHER PUBLICATIONS

Guan, Yingxiang. "Large area perovskite solar cell and module manufacturing process" China Master's Theses Full-text Database Engineering Technology. No. 11. Nov. 15, 2016 (Nov. 15, 2016). pp. 1-73.

*Primary Examiner* — Anthony Ho
(74) *Attorney, Agent, or Firm* — Gang Yu

(57) ABSTRACT

The disclosure discloses a perovskite film layer, a device and a preparation method for effectively improving the efficiency of perovskite optoelectronics. The perovskite film layer consists of a layer with discontinuous, irregularly distributed perovskite crystal grains and an organic insulating layer with a low refractive index embedded between the perovskite crystal grains. The perovskite crystal grains form a plurality of convex portions, and the organic insulating layer forms a plurality of concave portions between the convex portions. By adding an excess of an alkylammonium salt and/or an organic molecule with a specific functional group to perovskite precursor solution, a concave-convex film layer structure is spontaneously formed, and an upper charge transport layer and an electrode form pleated concave-convex structures. Such a special perovskite thin film structure formed by a simple solution method can effectively (Continued)

improve the light-outcoupling efficiency and enhance the performance of the perovskite light-emitting device.

20 Claims, 12 Drawing Sheets

(51) Int. Cl.
*H01L 51/52* (2006.01)
*H01L 51/56* (2006.01)

(52) U.S. Cl.
CPC .......... *H01L 51/5275* (2013.01); *H01L 51/56* (2013.01); *H01L 2251/558* (2013.01)

(56) References Cited

FOREIGN PATENT DOCUMENTS

| | | | |
|---|---|---|---|
| CN | 107068865 A | 8/2017 |
| CN | 107438907 A | 12/2017 |
| CN | 107507918 A | 12/2017 |
| JP | 2008227330 A | 9/2008 |
| JP | 2014229747 A | 12/2014 |
| KR | 20170028054 A | 3/2017 |

* cited by examiner

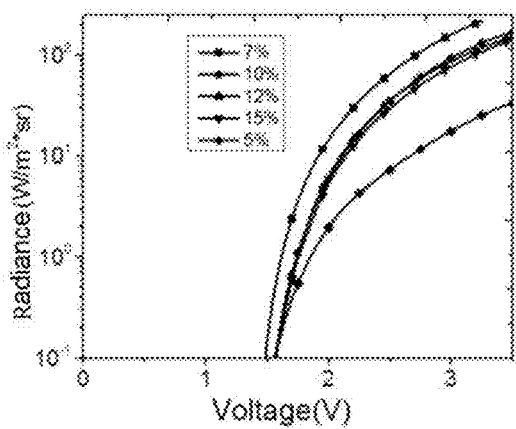
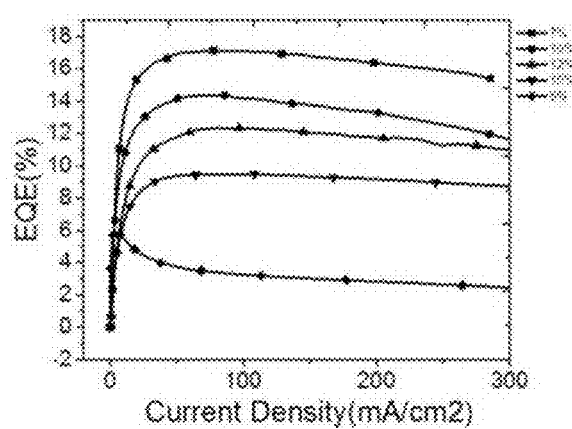
Fig. 19    Fig. 20
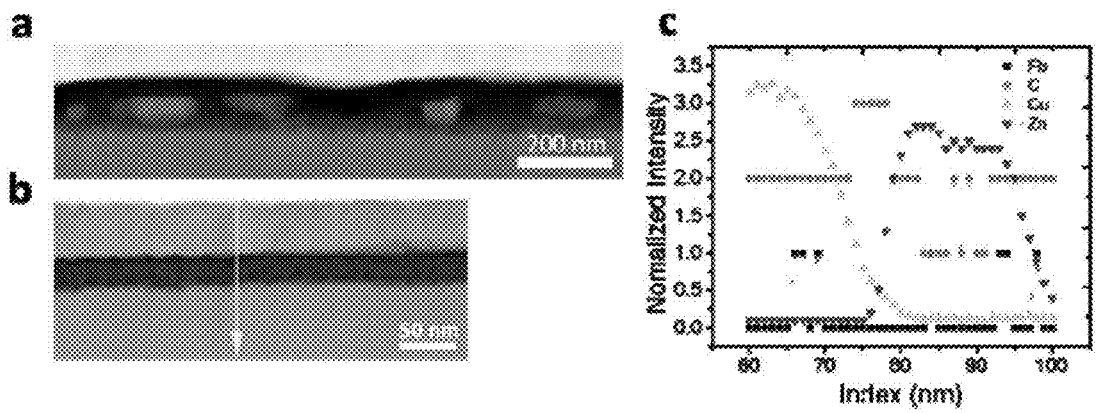
Fig. 21
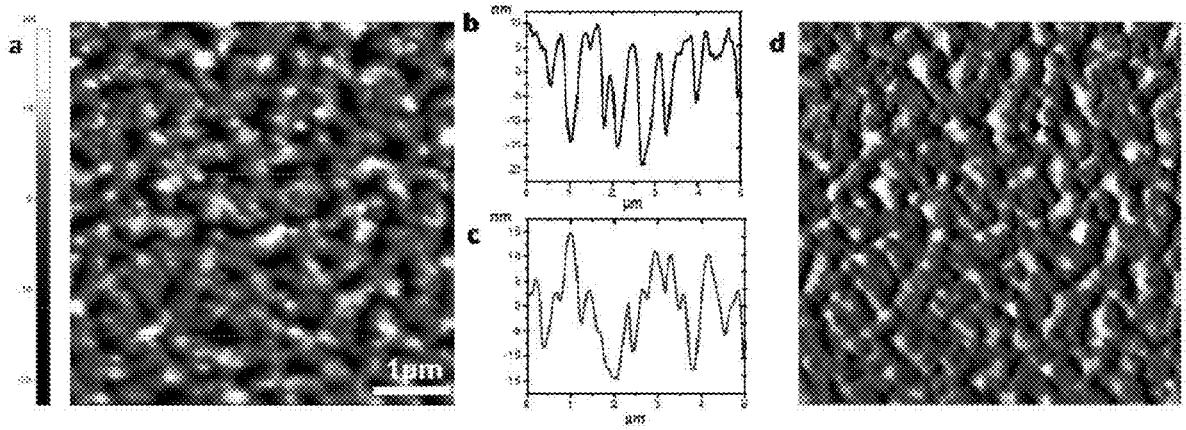
Fig. 22

PEROVSKITE FILM LAYER, DEVICE AND PREPARATION METHOD FOR EFFECTIVELY IMPROVING EFFICIENCY OF LIGHT-EMITTING DEVICE

TECHNICAL FIELD

The disclosure relates to a perovskite light-emitting diode, and in particular to a perovskite film layer, a device and a preparation method for effectively improving the efficiency of a perovskite device.

BACKGROUND

Organic-inorganic hybrid perovskite has advantages of simple preparation processes, adjustable colors, high color purity, and solution preparation and the like, exhibiting the potential to realize low-cost mass production in the photoelectric field. In the past two years, the external quantum efficiency of perovskite light-emitting diode (PeLED) was increased rapidly. At present, the external quantum efficiency of three-dimensional green light PeLED reaches 8.53%, "Overcoming the electroluminescence (EL) efficiency limitations of perovskite light-emitting diodes, Science, 2015, 350(6265), 1222"; and the external quantum efficiency of a multi-quantum well near-infrared PeLED reaches 11.7%, "Perovskite light-emitting diodes based on solution-processed self-organized multiple quantum wells, Nat. Photonics, 2016, 10, 699". However, the external quantum efficiency of the perovskite light-emitting diodes is still a certain distance away from the commercialization requirements, so it is necessary to further improve the external quantum efficiency of PeLED devices.

In the existing perovskite light-emitting device, due to a large refractive index of a perovskite layer, there is a big difference between the perovskite layer, Indium Tin Oxide (ITO) electrode, the glass substrate and the air in refractive indexes. It causes that only a small part of light is emitted from the substrate, and a large part of the light is trapped in the glass or plastic substrate, device functional layer in a waveguide mode or lost near the metal electrode in surface plasma, which results in a lower light extraction efficiency of the device. In Organic Light-Emitting Diode (OLED), in order to improve the light extraction efficiency of device, it is usually to suppress the waveguide mode in the light-emitting device by introducing a patterned grating structure, which enhances the light extraction of the substrate, "Enhanced light out-coupling of organic light-emitting devices using embedded low-index grids, Nat Photonics, 2008, 2, 483". Or a periodic pattern structure is prepared on the substrate, so that a concave-convex pleated structure is formed in the device, and the light extraction efficiency of the device is improved, "Light extraction from organic light-emitting diodes enhanced by spontaneously formed buckles, Nat. Photonics, 2010, 4, 222". However, this method improves the light extraction efficiency by means of the periodic structure, and it may distort the light-output spectrum and directionality of the device. Moreover, it requires either complicated processes to prepare the grating structure, such as photoetching, or complicated methods to form the pleated structure on the substrate, such as thin film transfer, so the preparation process is complicated, and the cost is higher.

SUMMARY

A technical problem to be solved by the present disclosure is to provide a perovskite film layer, a device and a preparation method for effectively improving the efficiency of a perovskite device in allusion to the deficiencies of an existing technology. By means of a simple solution preparation method, a new perovskite film structure is realized, the formed perovskite thin film has higher crystallinity, and the light-outcoupling efficiency of the device may be effectively improved, so the external quantum efficiency of the PeLED device is improved.

A technical scheme of the present disclosure is as follows.

A perovskite film layer for effectively improving the efficiency of a light-emitting device, the perovskite film layer consists of a layer with discontinuous, irregularly distributed perovskite crystal grains and an organic insulating layer with a low refractive index, while the organic insulating layer is embedded between the perovskite crystal grains, herein, the perovskite crystal grains form a plurality of convex portions, and the organic insulating layer forms a plurality of concave portions between the convex portions. The refractive index of the organic insulating, layer is lower than that of perovskite, so that a part of light trapped in the device may be emitted through the substrate, and the out-coupling efficiency of the light-emitting device may be improved, thereby the external quantum efficiency of the light-emitting device is improved.

The perovskite film layer, the organic insulating layer is spontaneously formed by adding an excess of an alkylammonium salt and/or an organic molecule with a specific functional group to perovskite precursor solution, and performing a combination or reaction with a substrate thin film.

The perovskite film layer, a thickness of the organic insulating layer is between 1 nm and 300 nm.

The perovskite film layer, the organic insulating layer may avoid a direct contact between a hole transport layer and an electron transport layer in the light-emitting device.

The perovskite film layer, a size of the perovskite crystal grains is between 3 nm and 100 µm.

The perovskite film layer, a thickness of the perovskite crystal grains is between 5 nm and 500 nm.

The perovskite film layer, the morphology of the perovskite film layer directly affects the morphology of an upper charge transport layer and an electrode, so that it may spontaneously form a concave-convex pleated structure, herein, the concave-convex pleated structure formed may further improve the light-outcoupling efficiency of the device, thereby the external quantum efficiency of the light-emitting device is improved.

A preparation method of the perovskite film layer for effectively improving the efficiency of a perovskite device, an excess of an alkylammonium salt and/or an organic molecule with a specific functional group is added to perovskite precursor solution and perform a combination or reaction with a substrate thin film to form an organic insulating layer, perovskite crystal grains in the film layer form a plurality of convex portions, and the organic insulating layer forms a plurality of concave portions between the convex portions.

In the preparation method, the organic insulating layer is spontaneously formed by adding the excess of the alkylammonium salt and/or the organic molecule having the specific functional group to the perovskite precursor solution to perform a combination or reaction with the substrate thin film, herein the alkylammonium salt includes $CH_3NH_3X$, and $NH_2CHNH_2X$; and the functional group of the organic molecule includes one or more selected from a group consisting of —X, —$NH_2$, —OH, —COOH, —CN, —NC, —SH, —$PH_2$, —SCN, —CHO, —$SO_3H$, —CH(O)CH, and X is a halogen.

The preparation method, the organic molecule is one or more of the following organic molecules:

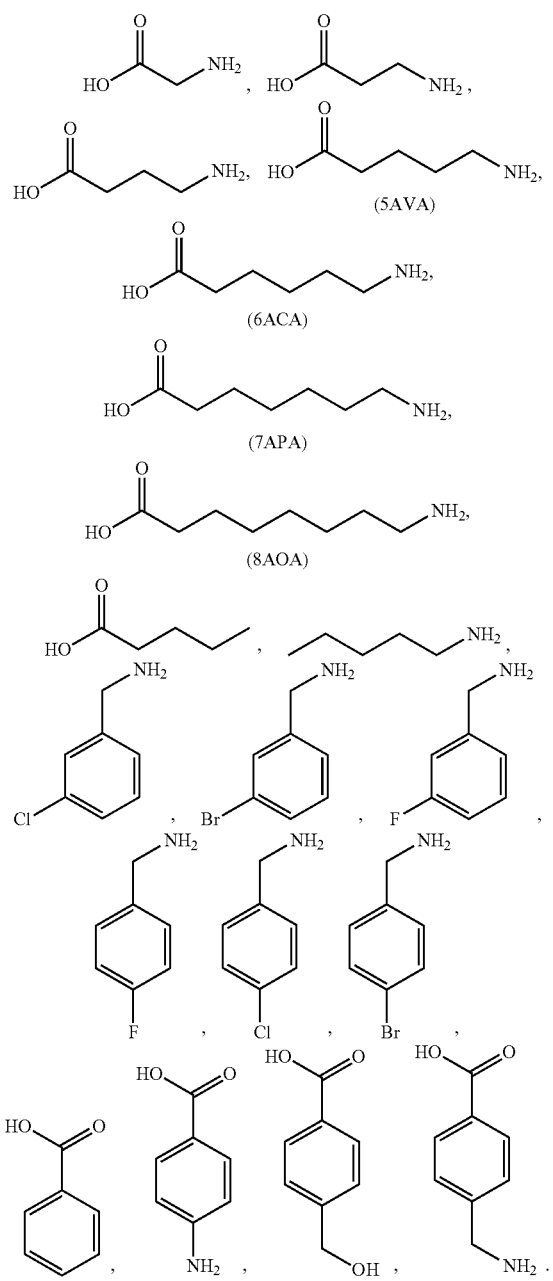

In the preparation method, the substrate thin film is a charge transport layer. In the preparation method, the charge transport layer includes PEDOT:PSS, PVK, TFB, PFB, Poly-TPD, F8, ZnO, TiO$_x$, SnO$_2$, NiO$_x$, and a multi-layer thin film modified with amino acid organics and polyamine organics.

In the preparation method, the amino acid organics include 5AVA, 6ACA, 7APA, and 8AOA, and the polyamine organics include PEI, PEIE, and PEOz.

In the preparation method, a structure general formula of the perovskite crystal grains is ABX$_3$, herein A is a metal cation or the alkylammonium salt, which includes arbitrary one or a combination of Rb$^+$, Cs$^+$, CH$_3$NH$_3^+$, and NH$_2$CHNH$_2^+$; B is a divalent metal cation, which includes one or more selected from Cu$^{2+}$, Ni$^{2+}$, CO$^{2+}$, Fe$^{2+}$, Mn$^{2+}$, Cr$^+$, PCl$^{2+}$, Cd$^{2+}$, Ge$^{2+}$, Se, Pb$^{2+}$, Eu$^{2+}$ and Yb$^{2+}$; X is a halogen anion, which includes one or more selected from I$^-$, Br$^-$, and Cl$^-$; and the perovskite precursor solution is prepared by enabling AX, BX$_2$ and the organic molecule to be dissolved in a solvent in a molar ratio of 1-100:1-100:0-100, and a mass fraction is 1%-50%.

The device according to the perovskite film layer includes a substrate, an anode, a hole transport layer, the perovskite film layer, an electron transport layer, and a cathode.

By adding the excess of the alkylammonium salt and/or the organic molecule with the specific functional group to the perovskite precursor solution, a special concave-convex film layer structure is spontaneously formed by discontinuously and irregularly distributed perovskite crystal grains and the organic insulating layer embedded between the perovskite crystal grains during a thin film preparation process, and it enables an upper charge transport layer and an electrode spontaneously to form pleated concave-convex structures. Such a special perovskite thin film structure formed by a simple solution method may effectively improve the light outcoupling efficiency of the light-emitting device, and a perovskite crystal may be modified by the added organic molecule, the defect density is reduced, the crystallinity of perovskite is improved, and finally the performance of the perovskite light-emitting device is optimized.

BRIEF DESCRIPTION OF THE DRAWINGS

FIG. 19 illustrates the dependence of voltage on radiance of the perovskite light-emitting diode in Embodiment 4;

FIG. 20 illustrates the dependence of current density on external quantum efficiency of the perovskite light-emitting diode in Embodiment 4;

FIG. 21 illustrates the STEM and EDX element analysis of a structured perovskite thin film; and Fig. a and Fig. b are STEM diagram of a perovskite thin film, and Fig. c is an EDX element analysis diagram in a corresponding position of Fig. b;

FIG. 22 illustrates an AFM image of a device prepared by the structured perovskite thin film; Fig. a illustrates the AFM image of an electrode surface, Fig. b and c illustrate surface height fluctuation diagrams of different areas in Fig. a, and Fig. d illustrates an AFM phase diagram;

DETAILED DESCRIPTION OF THE EMBODIMENTS

The present disclosure is described in detail below in combination with the specific embodiments.

Figure 1:
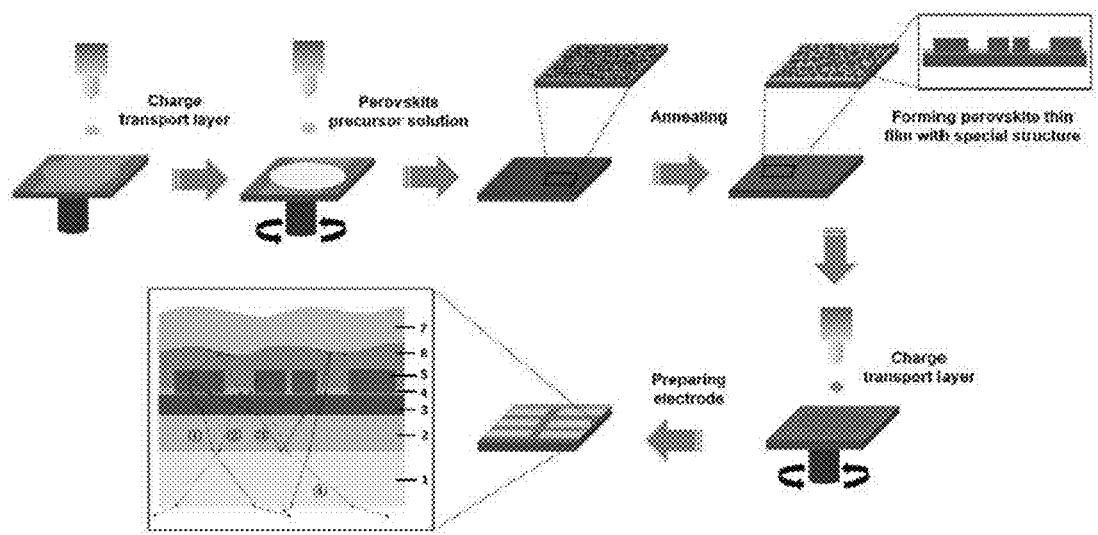
FIG. 1 illustrates the schematic diagram of preparation process and formation of a perovskite film layer with a special structure.

As shown in FIG. 1, from bottom to top, it successively includes: a substrate 1, a cathode layer 2, an electron transport layer 3, an organic layer 4, a perovskite layer 5, a hole transport layer 6 and a anode layer 7. The substrate 1 may be one of glass, a flexible substrate and a metal thin sheet; the cathode layer 2 is a transparent electrode, and may be indium tin oxide (ITO), and a silver nanowire; the electron transport layer 3 is made of a metal oxide, and modified with an organic containing an amino group or a carbonyl group (such as PEIE, PEI and PEOz); the organic layer 4 is spontaneously formed by adding an excess of an alkylammonium salt and/or an organic molecule with a specific functional group to perovskite precursor solution to perform a combination or reaction with a substrate thin film; the material of the perovskite layer 5 is saw in process steps for details; the hole transport layer 6 is Poly(9,9-dioctylfluorene-co-fluorenone)(TFB), Poly[bis(4-phenyl)(4-butylphenyl)amine](Poly-TPD), [N,N'-(4-n-butylphenyl)-N,N'-diphenyl-p-phenylenediamine]-[9,9-di-n-octylfluorenyl-2,7-diyl]copolymer (PFB), Poly9,9-dioctylfluorene (F8), 2,2',7,7'-tetrakis[N,N-di(4-methoxyphenyl)amino]-9,9'-spirobifluorene (Spiro-MeOTAD), or a carbazole polymer, an aromatic diamine compound or a star triphenylamine compound, the carbazole polymer may be polyvinyl carbazole (PVK), the aromatic diamine compound may be N,N'-bis-(3-methylphenyl)-N,N'-diphenyl-[1,1'-biphenyl]-4,4'-diamine (TPD) or N,N'-bis(3-naphthyl)-N,N'-diphenyl-[1,1'-dipenyl]-4,4'-diamine (NPB), and the star triphenylamine; compound may be tri-[4-(5-phenyl-2-thienyl)benzene] amine (PTDATA, series); and the anode layer 7 is metal (one of Au, Al, Cu and Ag), and modified with an interface modification layer $MoO_3$.

FIG. 1 shows the preparation process and the structure of a perovskite device with a special structure. The excess of the alkylammonium salt and/or the organic molecule with the functional group is added to the perovskite solution to perform a combination or reaction with the substrate thin film, the organic insulating layer 4 is spontaneously formed, and the perovskite crystal grains 5 in the perovskite thin film layer are discontinuously and irregularly dispersed in the organic insulating layer 4. This type of the organic molecule may modify the perovskite thin film, so the quality of the perovskite crystal grains 5 is higher. A conventional perovskite thin film is continuous. Because the refractive index of the perovskite thin film is higher, only a part of emitted light is emitted from the substrate due to the total reflection at interfaces of perovskite/ZnO and ZnO/ITO. The present disclosure designs a new-type perovskite film layer structure, such a structure may enable the partial light trapped in the device to be emitted through the substrate, a route ① shows that the light emitted from the perovskite crystal grains is directly emitted to the air; a route ② shows that the wide-angle light emitted from the perovskite crystal grains is emitted to the air after being reflected by the organic layer (or a charge transport layer); a route ③ shows that due to the total reflection of the ITO/glass interface, the light trapped in the device is affected by the spontaneously formed discontinuous structure, and may be emitted to the air again after being reflected by the hole transport layer/electrode interface; and a route ④ shows that the upwards emitted light is affected by the discontinuous structure after being reflected, by a metal electrode, and emitted to the air after being reflected by the organic layer. Because the perovskite crystal grains are distributed in the organic insulating layer (or the charge transport layer) with a low refractive index, and the perovskite upper transport layer and the metal electrode are provided with concave-convex pleated structures, the structure may improve the light-outcoupling efficiency of the device, thereby the external quantum efficiency of the device is improved.

Process Steps:

1) Preparation of Perovskite Precursor Solution

A structure general formula of the perovskite crystal grains is $ABX_3$, herein A is a metal cation or an alkylammonium salt (including $Rb^+$, $Cs^+$, $CH_3NH_3+$, and $NH_2CHNH_2^+$); B is a divalent metal cation (including $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$ and $Yb^{2+}$); X is a halogen anion (including r, Br, and Cr); and a perovskite precursor solution is prepared by enabling AX, $BX_2$ and a organic molecule to be dissolved in a solvent (DMF, DMSO, and GBL) in a molar ratio of 1-100:1-100:0-100, while the organic molecule is one with one or more functional groups, such as —X, —$NH_2$, —OH, —COOH, —CN, —NC, —SH, —$PH_2$, —SCN, —CHO, —$SO_3$H, —CH(O)CH and —X a halogen. A mass fraction of the perovskite precursor solution is 1%-50%.

2) Device Preparation a) Transparent conducting substrate ITO glass is ultrasonic-washed for two times by acetone and ethanol solution respectively, and blow-dried by nitrogen, the ITO is transferred to an oxygen plasma cleaner, and oxygen plasma cleaning is performed on it under a vacuum condition.

b) An electron transport layer is prepared by a spin-coating method, and thermal annealing is performed respectively.

c) A perovskite layer is prepared by a one-step spin-coating method or a two-step spin-coating method; and after the spin-coating is started, one or a mixture of chlorobenzene, toluene, chloroform, methyl ether and ethyl acetate is dropwise added to control a crystallization process of a perovskite thin film, and a thermal annealing is performed to form a thin film with a special film layer structure, as shown in FIG. 1.

d) A hole transport layer is prepared by the spin-coating method continuously.

e) $MoO_3$ and Au are deposited on the surface of the hole transport layer by a thermal evaporation method to form a device with the special film layer structure.

Embodiment 1: Preparation of Perovskite Thin Film with New-Type Film Layer Structure A precursor solution is prepared by $NH_2C_4H_8COOH$ (5AVA), $NH_2CH=NH_2I$(FAI) and $PbI_2$ in a molar ratio of 0.5:2.4:1, a substrate provided with a charge transport layer is spin-coated with the precursor solution. The substrate is heated at 105° C. and annealed for 15 minutes, a perovskite thin film with a new-type film layer structure as shown in FIG. 1 is obtained.

Figure 2:
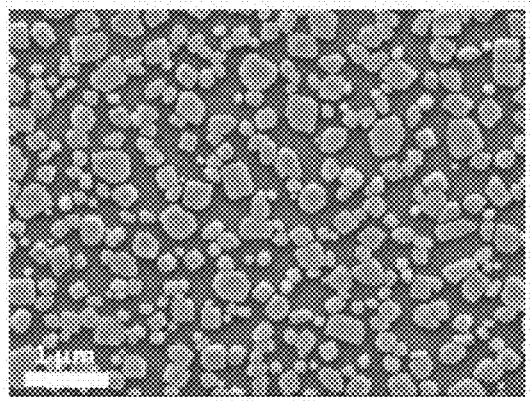
FIG. 2 illustrates the surface morphology of a perovskite film layer in SEM (scanning electron microscope)

FIG. 2 is a SEM image of the perovskite thin film, it may be discovered that the perovskite thin film is formed by many discontinuously and irregularly distributed perovskite crystal grains, the crystal quality is high, and the shape of the crystal grains is more regular.

Figure 3:
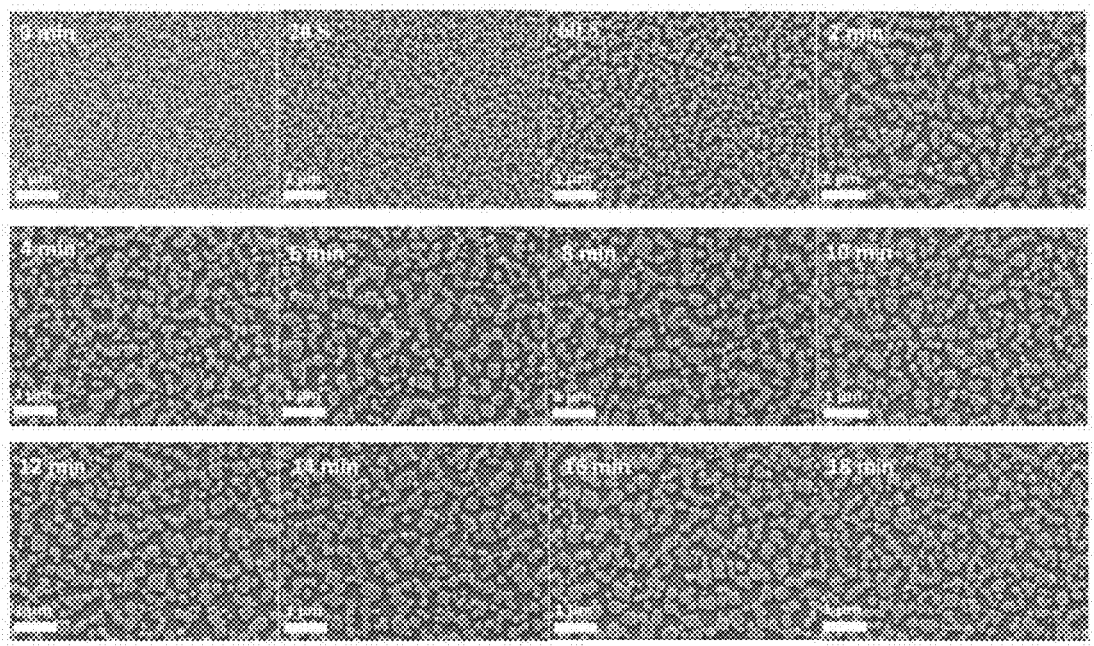
FIG. 3 illustrates a SEM image of a perovskite film layer in different annealing time.

FIG. 3 is a SEM image of the perovskite thin film in different annealing time. It may be discovered that a concave-convex film layer structure is formed by the perovskite crystal grains and an organic insulating layer embedded between the perovskite crystal grains, and it is changed along with the increase of the annealing time; the crystal grains on the surface of the perovskite thin film grew larger, and the shape of the crystal grains is more regular.

Figure 4:
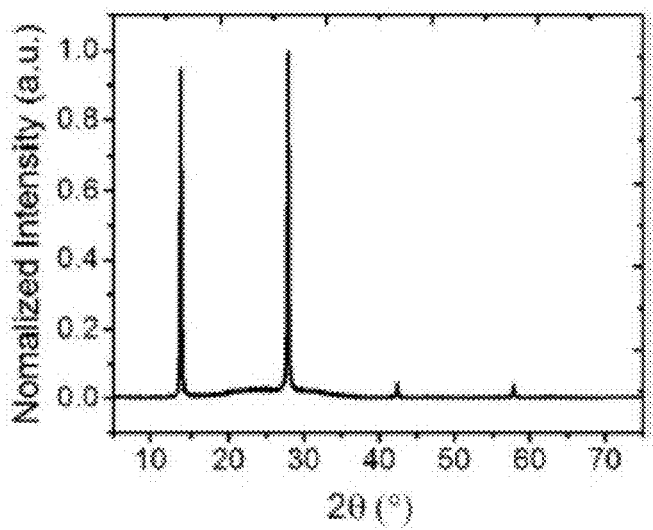
FIG. 4 illustrates an X-ray diffraction spectrum (XRD) of perovskite film layer.

FIG. 4 is the X-ray diffraction (XRD) data of the thin film. 13.7° and 27.8° in the XRD represent crystal planes (111) and (222) of the perovskite crystal respectively. Signals at these two peaks are very strong, indicating that the oriented growth of perovskite crystals in the perovskite thin film.

Figure 5:
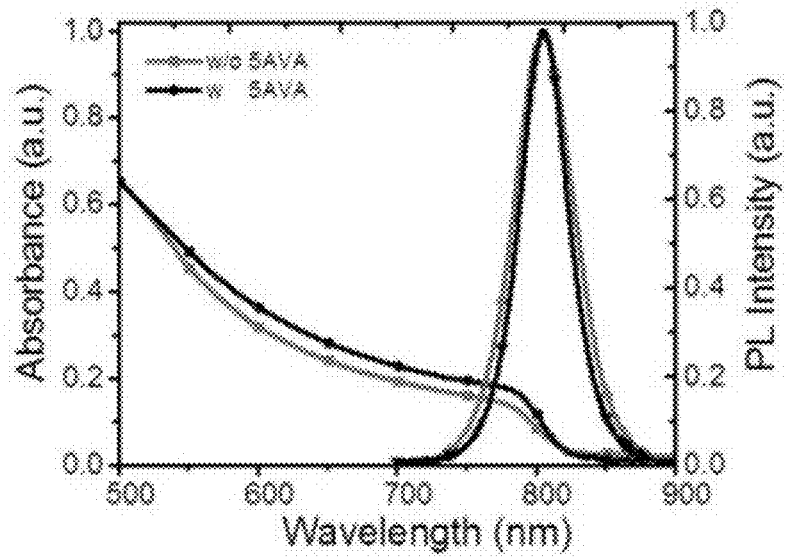
FIG. 5 illustrates the absorption and photoluminescence spectra of the perovskite film layer and a three-dimensional (FAPbI$_3$) thin film.

FIG. 5 is the ultraviolet-absorption spectrum and photoluminescence spectrum of the thin film and a control perovskite thin film (FAPbI$_3$). The perovskite thin film modified with 5AVA has narrow luminescence spectrum, indicating that the modified perovskite crystal is more ordered, and the crystal quality is higher.

Figure 6:
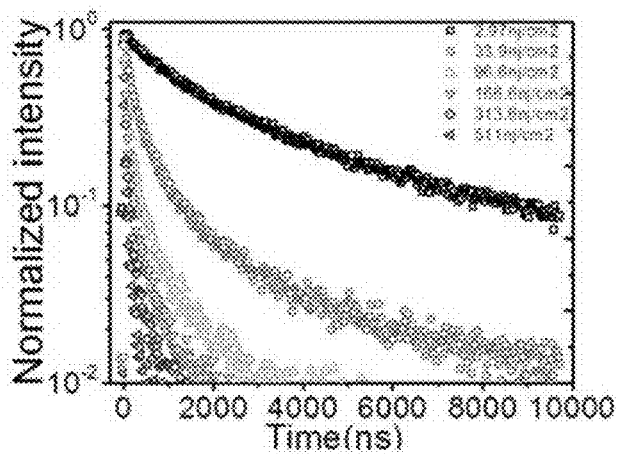
FIG. 6 illustrates the time-resolved PL decay transient of the perovskite film layer.

FIG. 6 is a TCSPC spectrum of the thin film, which illustrates that in low laser intensity, the fluorescent lifetime of the thin film is about 2 microseconds, which indicates that the defect density of the thin film is low, and the crystal quality is high.

Figure 7:
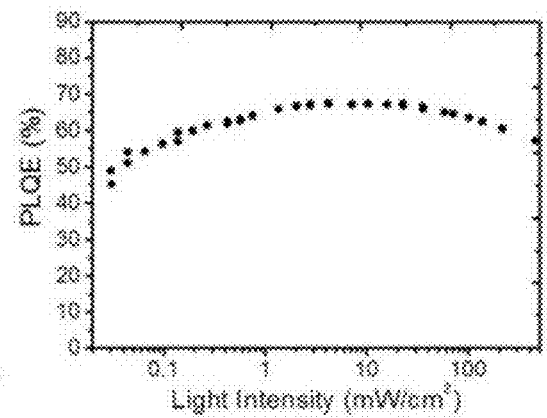
FIG. 7 illustrates the light-intensity dependent photoluminescence quantum efficiency (PLQE) of the perovskite film layer.

FIG. 7 is a laser intensity dependent photoluminescence quantum efficiency of the thin film. It may be discovered from the spectrum that the photoluminescence quantum efficiency of the thin film rapidly reaches a maximum value along with the increase of excitation intensity. This indicates that the defect density of the thin film is low, and the photoluminescence quantum efficiency maintains a high value of over 68% under high light intensity.

Embodiment 2: Preparation of Device Based on New-Type Perovskite Film Layer Structure A substrate is a glass-ITO combination, an electron transport-hole blocking layer is ZnO/PEIE, a light-emitting layer is the new-type perovskite thin film, a hole transport-electron blocking layer is TFB, and a top electrode is MoOx/Au, the whole device structure is described as follows: glass substrate/ITO/ZnO-PEIE/Perovskite/TFB/MoOx/Au. A preparation method is as follows.

① Transparent conducting substrate ITO glass is ultrasonic-washed by acetone solution, ethanol solution and deionized water, and blow-dried by dry nitrogen after being washed, herein ITO on the glass substrate is used as a positive electrode layer of the device, and the square resistance of the ITO is 15 Ω/□.

② The dried substrate is moved into a vacuum chamber, ultraviolet ozone pre-treatment is performed on the ITO glass for 10 minutes under an oxygen environment.

③ The pre-treated substrate is spin-coated with ZnO and PEIE respectively, and annealing treatment is performed, then it is transferred to a nitrogen glove box, by means of spin-coating on the substrate with precursor solution of NH$_2$C$_4$H$_8$COOH, NH$_2$CH=NH$_2$I and PbI$_2$ in a molar ratio of 0.5:2.4:1, the perovskite thin film with the new-type film layer structure is obtained after being annealed. TFB solution is coated above a light-emitting layer as a hole transport layer by spin-coating.

④ After preparation of each function layer, a MoO$_x$/Au composite electrode is prepared, an air pressure is 6×10$^{-7}$ Torr, a deposition rate is 0.1 nm/s, and the deposition rate and a thickness are monitored by a film thickness meter.

⑤ The prepared device is packaged in the glove box, and the glove box is 99.9% of nitrogen atmosphere.

⑥ The current-voltage-radiance characteristics of the device are tested, and luminescence spectrum parameters of the device are tested at the same time.

Figure 8:
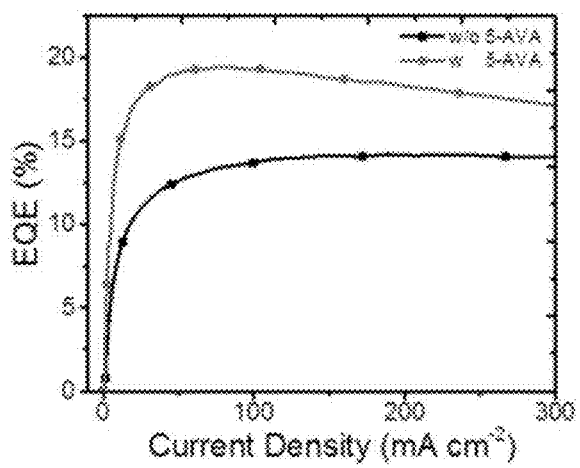
FIG. 8 illustrates the dependence of current density on external quantum efficiency (EQE) of a perovskite light-emitting diode in Embodiment 2.

FIG. 8 shows the dependence of current on external quantum efficiency of the prepared device. As shown in the figure, the peak external quantum efficiency of the device reaches 19.43%, and compared with an ordinary perovskite thin film device, the external quantum efficiency is greatly improved.

Figure 9:
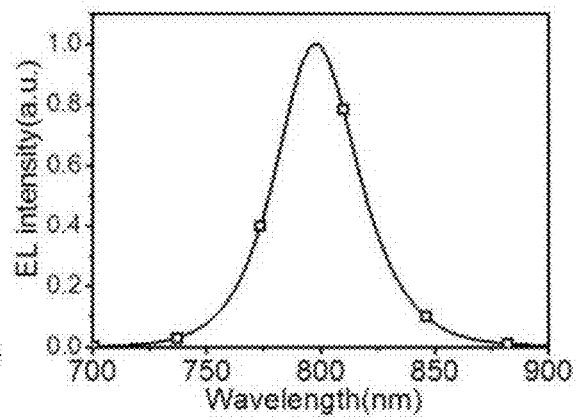
FIG. 9 illustrates an electroluminescence (EL) spectrum of the perovskite light-emitting diode in Embodiment 2.

FIG. 9 shows an electroluminescence spectrum of the prepared device. As shown in the figure, an electroluminescence peak of the device is at 802 nm.

Figure 10:
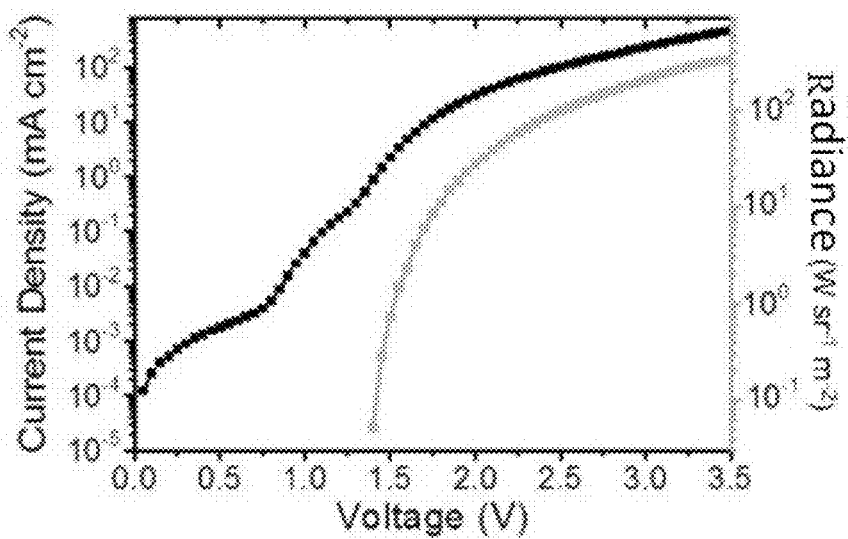
FIG. 10 illustrates the dependence of voltage on current density and voltage on radiance of the perovskite light-emitting diode in Embodiment 2.

FIG. 10 shows the dependence of voltage on current density and radiance of the prepared device. As shown in the figure, the maximum radiance of the device reaches 328 Wsr$^{-1}$m$^{-2}$.

Figure 11:
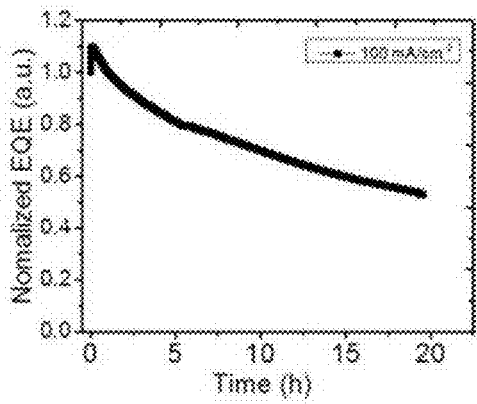
FIG. 11 illustrates the stability of the perovskite light-emitting diode in Embodiment 2.

FIG. 11 shows the stability of the device. As shown in the figure, because the formed perovskite thin film has high quality, the half-lifetime of the device is close to 20 hours under a large-current density of 100 mA cm$^{-2}$, which shows good stability.

Figure 12:
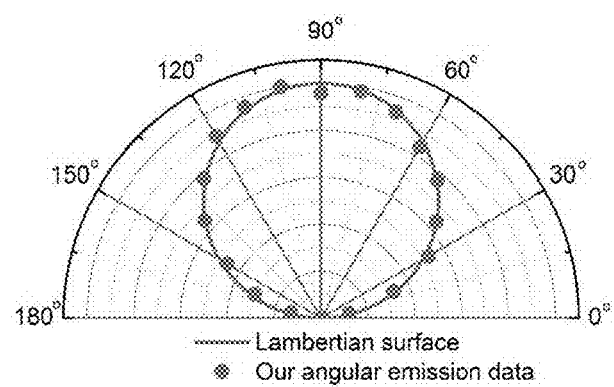
FIG. 12 illustrates the angular distribution of the radiation intensity of the perovskite light-emitting diode in Embodiment 2.

FIG. 12 shows the angular distribution of the radiation intensity of the device. As shown in the figure, the radiation intensity follows a Lambertian profile. It indicates that because the perovskite crystal grains are discontinuously and irregularly distributed in an organic insulting layer, such a special film layer structure does not introduce a periodic grating effect, which may change the luminescence spectrum and light-emitting directionality of the device.

Embodiment 3: Preparation of Device Based on New-Type Perovskite Film Layer Structure The device adopts the same device structure as in Embodiment 2. By spin-coating on the substrate with precursor solution of NH$_2$C$_4$H$_8$COOH(5AVA), NH$_2$CH=NH$_2$I (FAI) and PbI$_2$ in a molar ratio of 0.5:2:1, 0.5:2.2:1, 0.5:2.4:1, 0.5:2.6:1, 0.5:2.8:1, 0.5:3:1, 0.3:2.4:1, 0.7:2.4:1, and 0.9:2.4:1 respectively, after being annealed, a thin film with the new-type perovskite film layer structure is obtained, and a near infrared device is prepared.

Figure 13:
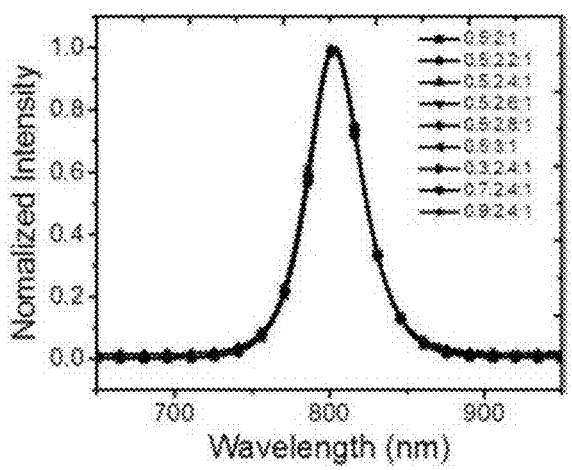
FIG. 13 illustrates an electroluminescence spectrum of the perovskite light-emitting diode in Embodiment 3.
Figure 14:
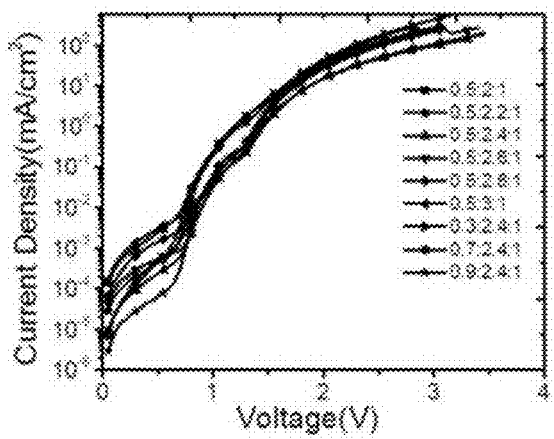
FIG. 14 illustrates the dependence of voltage on current density of the perovskite light-emitting diode in Embodiment 3.
Figure 15:
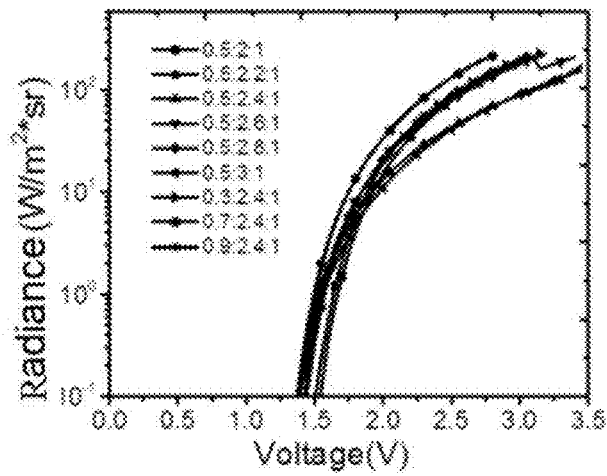
FIG. 15 illustrates the dependence of voltage on radiance of the perovskite light-emitting diode in Embodiment 3.
Figure 16:
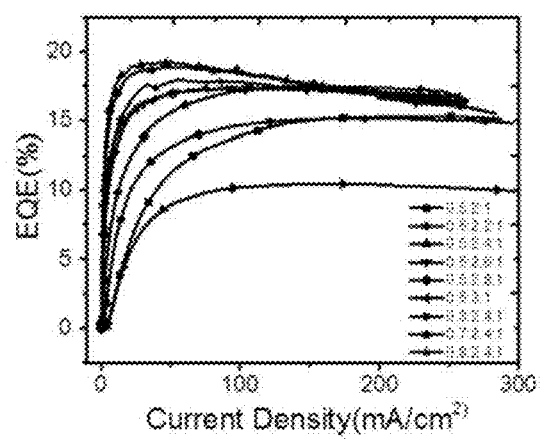
FIG. 16 illustrates the dependence of current density on external quantum efficiency of the perovskite light-emitting diode in Embodiment 3.

FIG. 13 shows an electroluminescence spectrum of the near infrared device, and the electroluminescence spectrum is basically the same under different ratios. FIG. 14, FIG. 15 and FIG. 16 are voltage-current density, voltage-radiance, and current density-external quantum efficiency characteristics curve diagrams of the device in the different ratios respectively, and this type of the device turns on at a low turn-on voltage of 1.4 V. The formation of a concave-convex structure of the perovskite thin film may be adjusted and controlled by changing the ratio of the precursor solution, while the ratio is 0.5:2.4:1, and the external quantum efficiency reaches a maximum of 19.4%.

Figure 17:
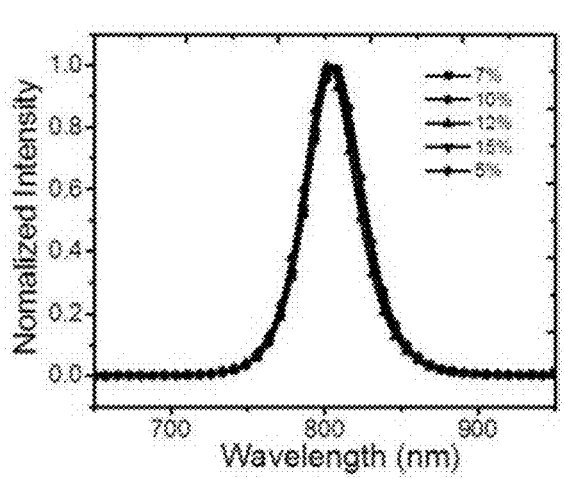
FIG. 17 illustrates an electroluminescence spectrum of the perovskite light-emitting diode in Embodiment 4.
Figure 18:
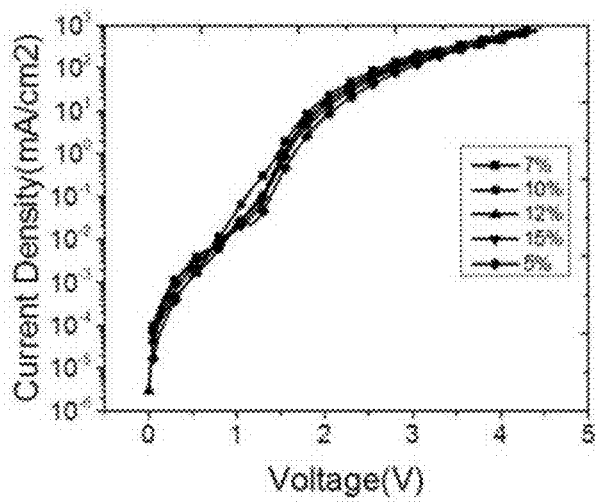
FIG. 18 illustrates the dependence of voltage on current density of the perovskite light-emitting diode in Embodiment 4.

Embodiment 4: Preparation of Device Based on New-Type Perovskite Film Layer Structure The device adopts the same device structure as in Embodiment 2. By spin-coating on the substrate with different concentrations (5%, 7%, 10%, 12% and 15%) of precursor solution of NH$_2$C$_4$H$_8$COOH(5AVA), NH$_2$CH=NH$_2$I(FAI) and PbI$_2$ in a molar ratio of 0.5:2.4:1, after being annealed, a thin film with the new-type perovskite film layer structure is obtained, and a near infrared device is prepared. FIG. 17 is an electroluminescence spectrum of the near infrared device, and the electroluminescence spectrum is basically the same under the different concentrations. FIG. 18, FIG. 19 and FIG. 20 are voltage-current density, voltage-radiance, and current density-external quantum efficiency characteristics curve diagrams of the device in the different concentrations respectively. As shown in the figures, while the concentration is 7%, the external quantum efficiency of the device reaches a maximum.

Embodiment 5: Preparation of Device Based on New-Type Perovskite Film Layer Structure The prepared device based on the new-type perovskite film layer structure is observed through a STEM electronic microscope, as shown in FIG. 21. It may be observed from Fig. a that a compact organic layer is spontaneously formed on the ZnO/PEIE surface of a substrate, and perovskite crystal grains are dispersed above this organic layer to form a concave-convex structure. There is a very thin organic layer under the perovskite crystal grains, and it is thinner than the organic layer between the perovskite crystal grains. Element analysis is performed on an area shown in Fig. b through EDX, it may be discovered from Fig. c that there is a Carbon-enriched compact organic layer on the ZnO/PEIE surface of the substrate, and the existence of such a structure is further proved. At the same time, the TFB and Au top layers on perovskite are affected by the morphology of the perovskite film layer, and provided with a concave-convex pleated structure, as shown in an AFM image of the device electrode surface in FIG. 22. Fig. a is the AFM image of the device electrode surface, Fig. b and Fig. c are surface height fluctuation diagrams in different areas of the Fig. a. It may be apparently observed that the upper thin film is affected by the perovskite thin film and provided with the concave-convex morphology. Fig. d is an AFM phase diagram, and the pleated morphology of the electrode surface may be apparently observed.

Embodiment 6: Preparation of Device Based on New-Type Perovskite Film Layer Structure The device adopts the same device structure as in Embodiment 2, by spin-coating on the substrate with precursor solution of $NH_2C_6H_{12}COOH(7AVA)$, $NH_2CH=NH_2I(FAI)$ and $PbI_2$ in a molar ratio of 0.5:2.4:1, after being annealed, a thin film with the new-type perovskite film layer structure is obtained, and a near infrared device is prepared.

Figure 23:
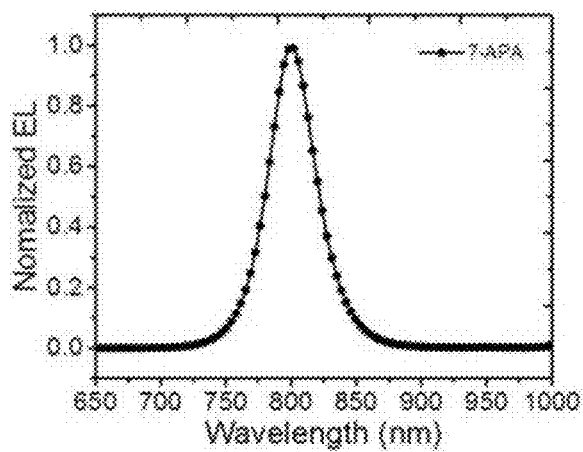
FIG. 23 illustrates an electroluminescence spectrum of the perovskite light-emitting diode in Embodiment 6.
Figure 24:
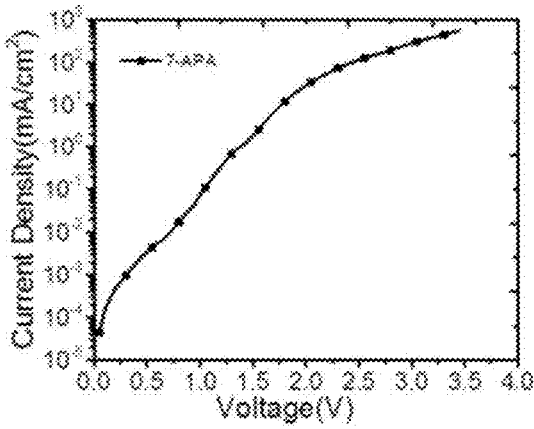
FIG. 24 illustrates the dependence of voltage on current density of the perovskite light-emitting diode in Embodiment 6.
Figure 25:
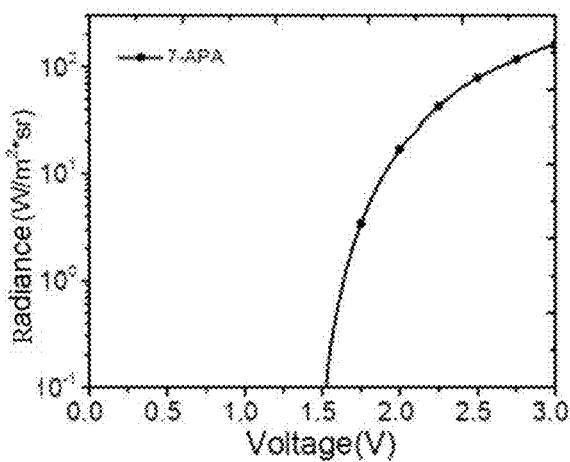
FIG. 25 illustrates the dependence of voltage on radiance of the perovskite light-emitting diode in Embodiment 6.
Figure 26:
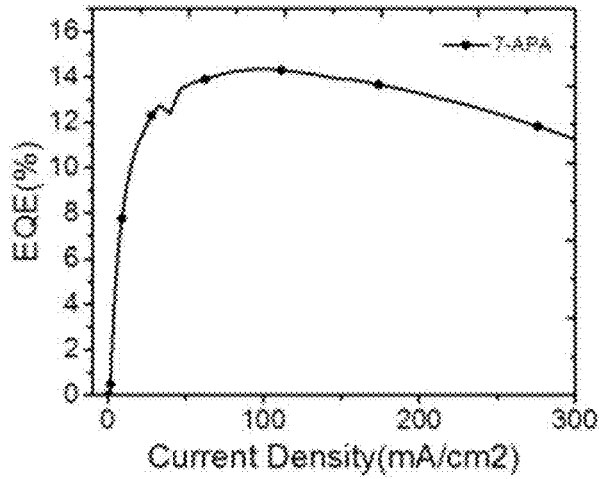
FIG. 26 illustrates the dependence of current density on external quantum efficiency of the perovskite light-emitting diode in Embodiment 6.

FIG. 23 is an electroluminescence spectrum of the near infrared device. FIG. 24, FIG. 25 and FIG. 26 are voltage-current density, voltage-radiance, and current density-external quantum efficiency characteristics curve diagrams of the device in the different concentrations respectively. It may be discovered that the device turns on at a voltage of 1.5 V, and the external quantum efficiency reaches 14.3%.

Embodiment 7: Preparation of Device Based on New-Type Perovskite Film Layer Structure The device adopts the same device structure as in Embodiment 2. By spin-coating on the substrate with precursor solution of $BrC_6H_4CH_2NH_2$, $NH_2CH=NH_2I(FAI)$ and $PbI_2$ in a molar ratio of 0.5:3.4:1.8, and a concentration of the solution is 12%, after being annealed, a thin film with the new-type perovskite film layer structure is obtained, and a near infrared device is prepared.

Figure 27:
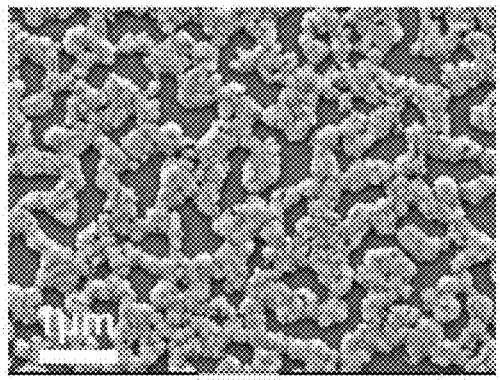
FIG. 27 illustrates a SEM image of a perovskite thin film in Embodiment 7.
Figure 28:
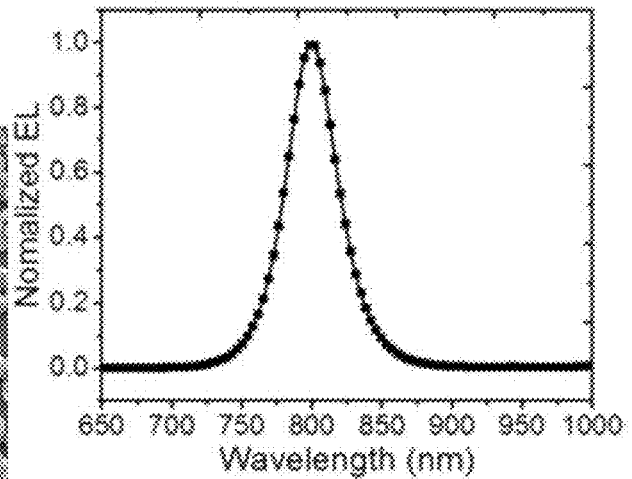
FIG. 28 illustrates an electroluminescence spectrum of the perovskite light-emitting diode in Embodiment 7.
Figure 29:
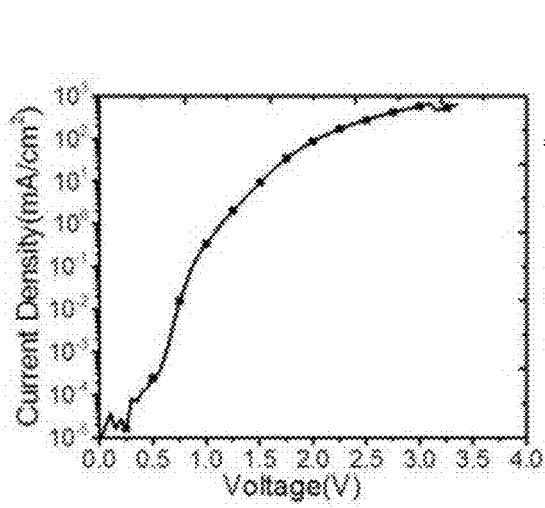
FIG. 29 illustrates the dependence of voltage on current density of the perovskite light-emitting diode in Embodiment 7.
Figure 30:
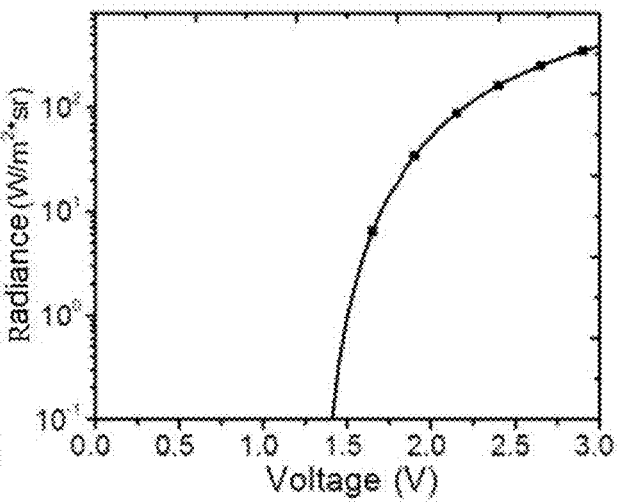
FIG. 30 illustrates the dependence of voltage on radiance of the perovskite light-emitting diode in Embodiment 7.
Figure 31:
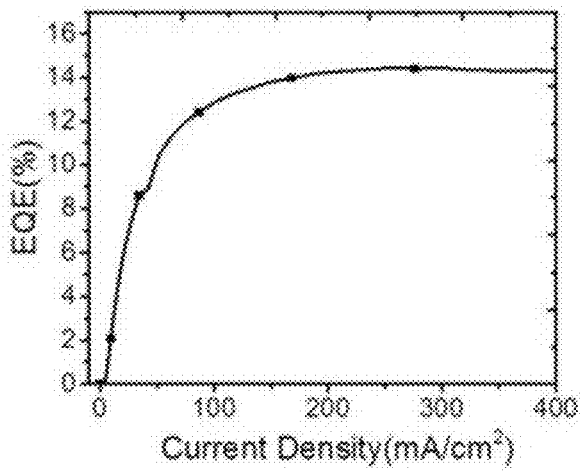
FIG. 31 illustrates the dependence of current density on external quantum efficiency of the perovskite light-emitting diode in Embodiment 7.

FIG. 27 is an SEM image of the thin film, and it may be observed that the perovskite thin film is provided with a special film layer structure. FIG. 28 is an electroluminescence spectrum of the near infrared device. FIG. 29, FIG. 30 and FIG. 31 are voltage-current density, voltage-radiance, and current density-external quantum efficiency characteristics curve diagrams of the device in the different concentrations respectively. It may be discovered that the device turns on at a voltage of 1.4 V, and the external quantum efficiency reaches 14.4%.

Embodiment 8: Preparation of Device Based on New-Type Perovskite Film Layer Structure The device adopts the same device structure as in Embodiment 2. By spin-coating on the substrate with precursor solution of $ClC_6H_4CH_2NH_2$, $NH_2CH=NH_2I(FAI)$ and $PbI_2$ in a molar ratio of 0.5:3.4:1.8, and a concentration of 12%, after being annealed, a thin film with the new-type perovskite film layer structure is obtained, and a near infrared device is prepared.

Figure 32:
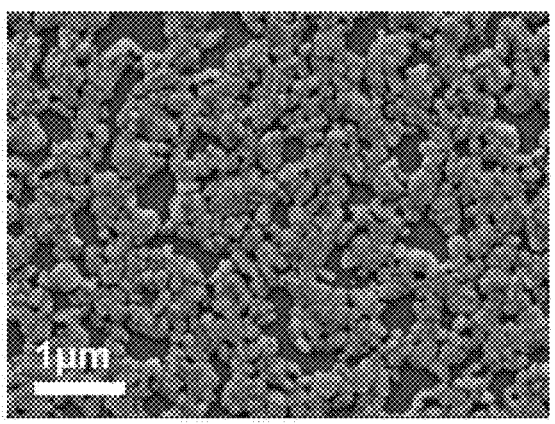
FIG. 32 illustrates a SEM image of a perovskite thin film in Embodiment 8.
Figure 33:
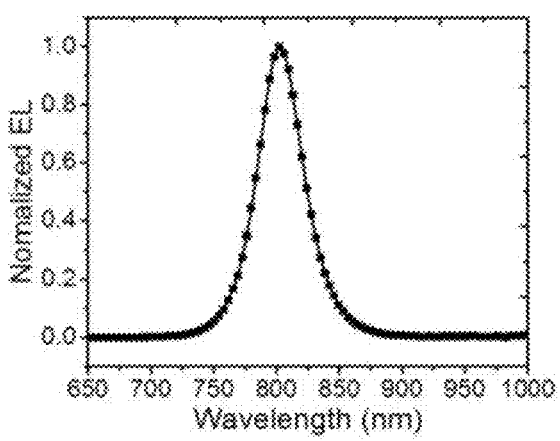
FIG. 33 illustrates an electroluminescence spectrum of the perovskite light-emitting diode in Embodiment 8.
Figure 34:
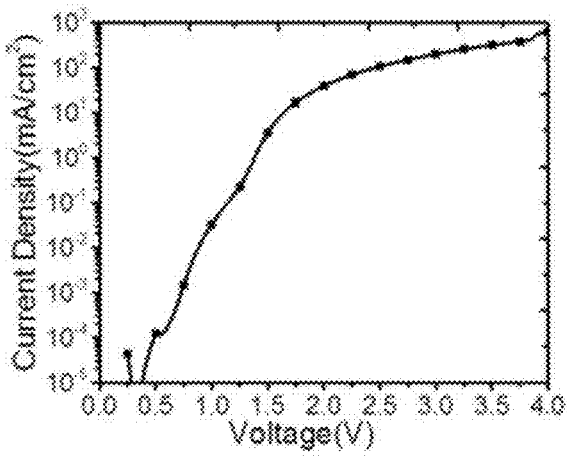
FIG. 34 illustrates the dependence of voltage on current density of the perovskite light-emitting diode in Embodiment 8.
Figure 35:
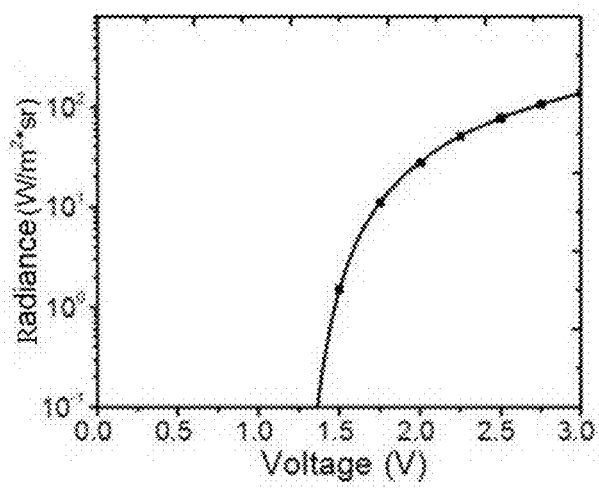
FIG. 35 illustrates the dependence of voltage on radiance of the perovskite light-emitting diode in Embodiment 8.
Figure 36:
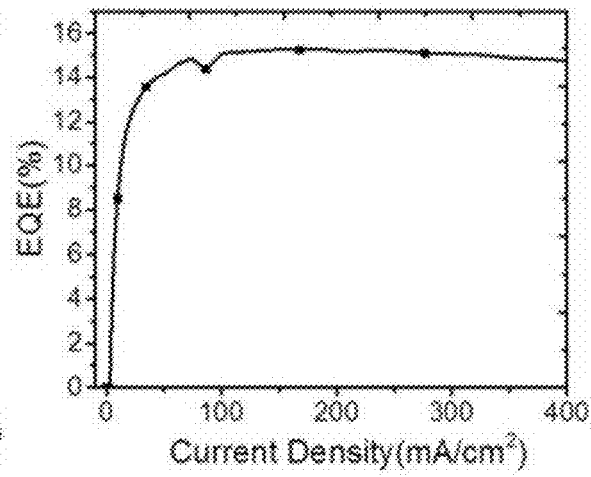
FIG. 36 illustrates the dependence of current density on external quantum efficiency of the perovskite light-emitting diode in Embodiment 8.

FIG. 32 is an SEM image of the thin film, which indicates the structured perovskite thin film. FIG. 33 is an electroluminescence spectrum of the device. FIG. 34, FIG. 35 and FIG. 36 are voltage-current density, voltage-radiance, and current density-external quantum efficiency characteristics curve diagrams of the device in the different concentrations respectively. The device turns on at a voltage of 1.4 V, and the external quantum efficiency reaches 15.2%.

Embodiment 9: Preparation of Device Based on New-Type Perovskite Film Layer Structure The device adopts the same device structure as in Embodiment 2. By spin-coating on the substrate with precursor solution of $NH_2C_4H_5COOH(5AVA)$, $NH_2CH=NH_2I$ (FAI), $NH_2CH=NH_2Br$, CsI and $PbI_2$ in a molar ratio of 0.5:0.4:0.5:1:1, after being annealed, a thin film with the new-type perovskite film layer structure is obtained, and a red light device is prepared.

Figure 37:
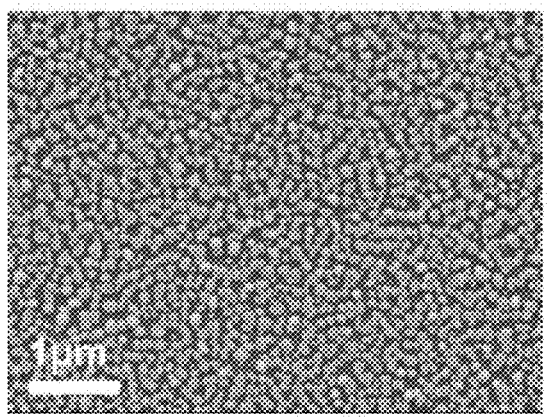
FIG. 37 illustrates a SEM image of a perovskite thin film in Embodiment 9.
Figure 38:
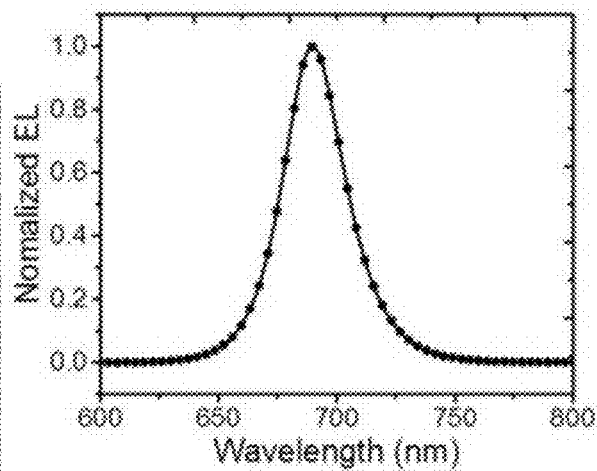
FIG. 38 illustrates an electroluminescence spectrum of the perovskite light-emitting diode in Embodiment 9.
Figure 39:
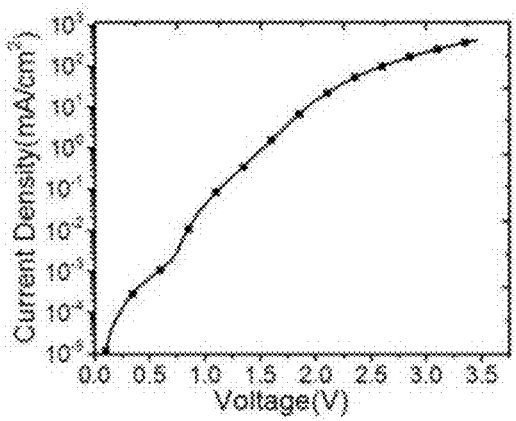
FIG. 39 illustrates the dependence of voltage on current density of the perovskite light-emitting diode in Embodiment 9.
Figure 40:
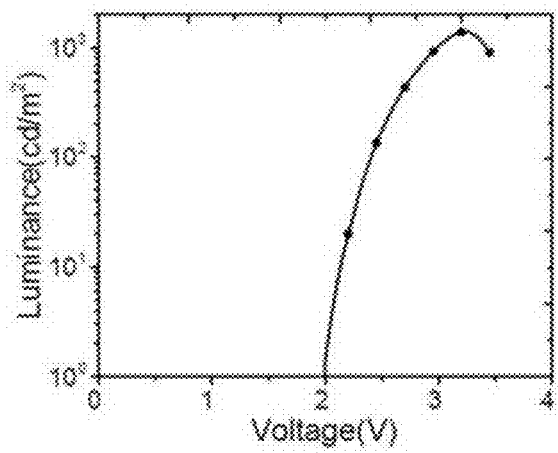
FIG. 40 illustrates the dependence of voltage on luminance of the perovskite light-emitting diode in Embodiment 9.
Figure 41:
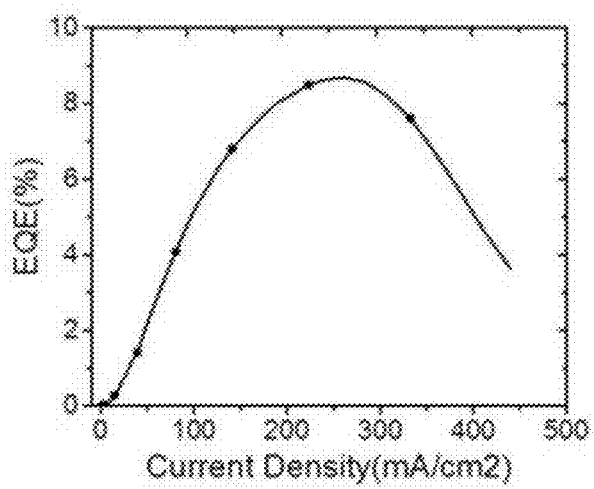
FIG. 41 illustrates the dependence of current density on external quantum efficiency of the perovskite light-emitting diode in Embodiment 9.

FIG. 37 is an SEM image of the thin film, which indicates the structured perovskite thin film. FIG. 38 is an electroluminescence spectrum of the device, and the electroluminescence peak of the device is 690 nm. FIG. 39, FIG. 40 and FIG. 41 are voltage-current density, voltage-luminance, and current density-external quantum efficiency characteristics curve diagrams of the device respectively. The device turns on at a voltage of 2 V, showing a maximum luminance of over 1000 cd/m$^2$ and an peak external quantum efficiency of 8.6%, which is the highest efficiency of red perovskite light-emitting diodes.

Embodiment 10: Preparation of Device Based on New-Type Perovskite Film Layer Structure The device adopts the same device structure as in Embodiment 2. By spin-coating on the substrate with precursor solution of $NH_2C_4H_8COOH(5AVA)$, $NH_2CH=NH_2I$ (FAI), $NH_2CH=NH_2Br$, CsI, $PbBr_2$ and $PbI_2$ in a molar ratio of 0.3:0.3:0.6:1:0.6:0.4, after being annealed, a thin film with the new-type perovskite film layer structure is obtained, and a red light device is prepared.

Figure 42:
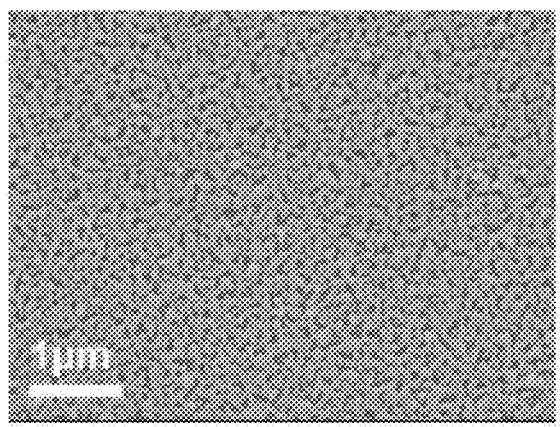
FIG. 42 illustrates a SEM image of a perovskite thin film in Embodiment 10.
Figure 43:
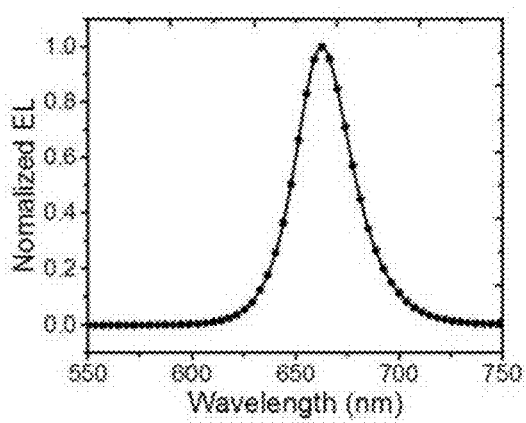
FIG. 43 illustrates an electroluminescence spectrum of the perovskite light-emitting diode in Embodiment 10.
Figure 44:
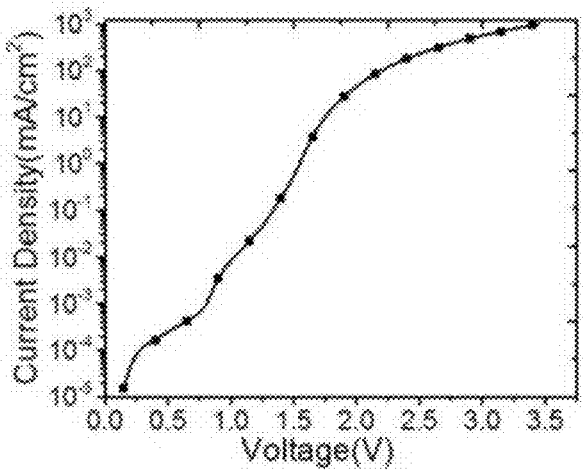
FIG. 44 illustrates the dependence of voltage on current density of the perovskite light-emitting diode in Embodiment 10.
Figure 45:
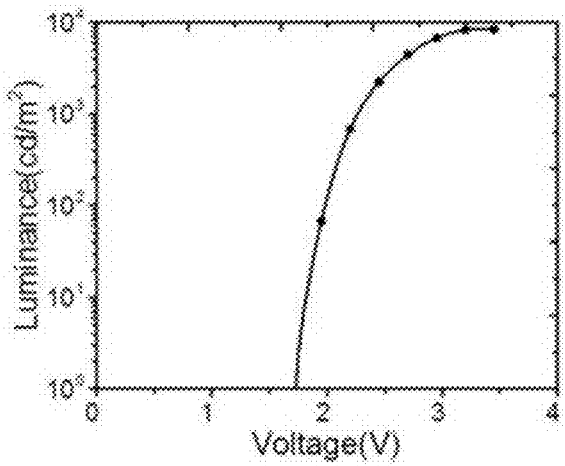
FIG. 45 illustrates the dependence of voltage on luminance of the perovskite light-emitting diode in Embodiment 10.
Figure 46:
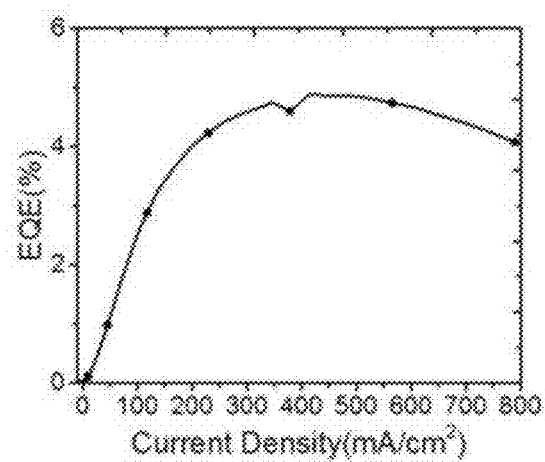
FIG. 46 illustrates the dependence of current density on external quantum efficiency of the perovskite light-emitting diode in Embodiment 10.

FIG. 42 is an SEM image of the thin film, which indicates the structured perovskite thin film. FIG. 43 is an electroluminescence spectrum of the red light device, and the electroluminescence peak of the device is 662 nm. FIG. 44, FIG. 45 and FIG. 46 are voltage-current density, voltage-luminance, and current density-external quantum efficiency characteristics curve diagrams of the device respectively. The device turns on at a voltage of 1.75 V, showing a maximum luminance close to 1000 cd/m$^2$, which is the highest luminance of red light-emitting diodes. The peak external quantum efficiency reaches 4.8%.

Embodiment 11: Preparation of Device Based on New-Type Perovskite Film Layer Structure The device adopts the same device structure as in Embodiment 2. By spin-coating on the substrate with precursor solution of $NH_2C_4H_5COOH(5AVA)$, $NH_2CH=NH_2Br$ and $PbBr_2$ in a molar ratio of 0.5:2:1, after being annealed, a thin film with the new-type perovskite film layer structure is obtained, and a green light device is prepared.

Figure 47:
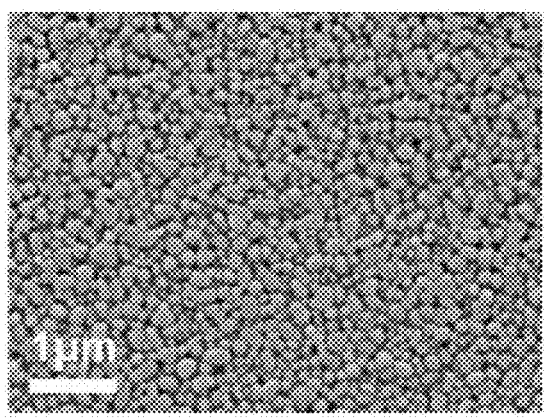
FIG. 47 illustrates a SEM image of a perovskite thin film in Embodiment 11.
Figure 48:
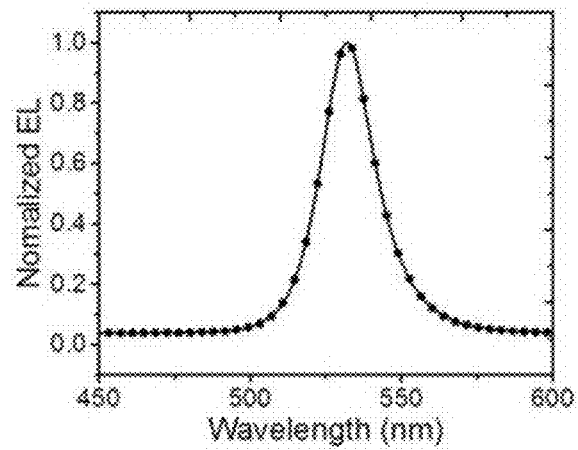
FIG. 48 illustrates an electroluminescence spectrum of the perovskite light-emitting diode in Embodiment 11.

FIG. 47 is an SEM image of the thin film, which indicates the structured perovskite thin film. FIG. 48 is an electroluminescence spectrum of the device, and the device which emits light at 535 nm may be achieved.

Embodiment 12: Preparation of Device Based on New-Type Perovskite Film Layer Structure The device adopts the same device structure as in Embodiment 2. By spin-coating on the substrate with precursor solution of $C_6H_5COOH$, $NH_2CH=NH_2I$ and $PbI_2$ in a molar ratio of 1:2:1.2 and a concentration of 10%, after being annealed, a thin film with the new-type perovskite film layer structure is obtained, and a near infrared device is prepared.

Figure 49:
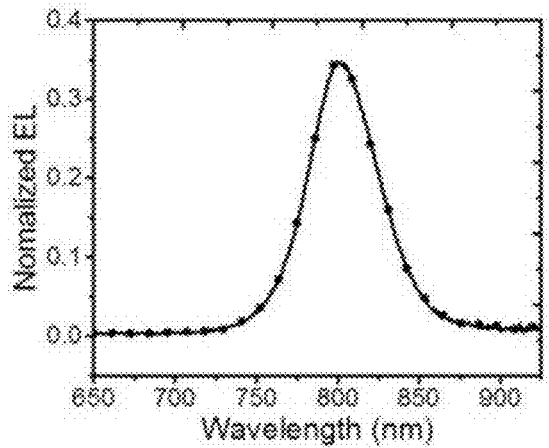
FIG. 49 illustrates an electroluminescence spectrum of the perovskite light-emitting diode in Embodiment 12.
Figure 50:
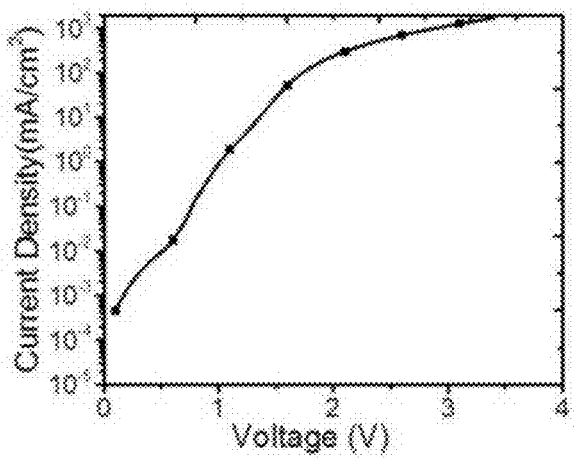
FIG. 50 illustrates the dependence of voltage on current density of the perovskite light-emitting diode in Embodiment 12.
Figure 51:
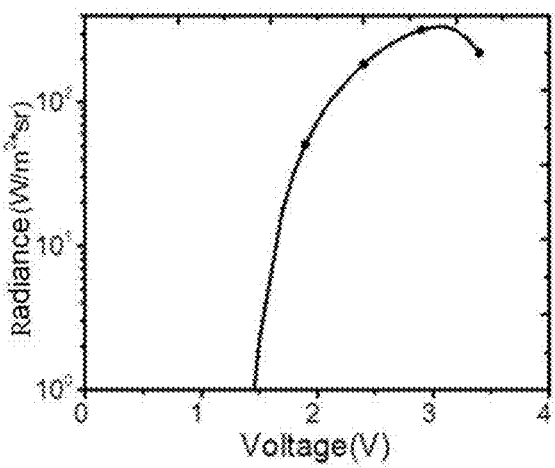
FIG. 51 illustrates the dependence of voltage on radiance of the perovskite light-emitting diode in Embodiment 12.
Figure 52:
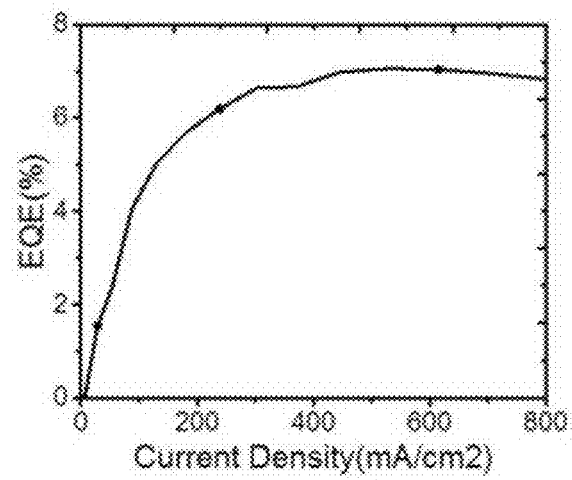
FIG. 52 illustrates the dependence of current density on external quantum efficiency of the perovskite light-emitting diode in Embodiment 12.

FIG. 49 is an electroluminescence spectrum of the near infrared device, and the electroluminescence peak of the device is 800 nm. FIG. 50, FIG. 51 and FIG. 52 are voltage-current density, voltage-radiance, and current density-external quantum efficiency characteristics curve diagrams of the device respectively. The device turns on at a voltage of 1.4 V, and the external quantum efficiency reaches 7%.

Embodiment 13: Preparation of Device Based on New-Type Perovskite Film Layer Structure The device adopts the same device structure as in Embodiment 2. By spin-coating on the substrate with precursor solution of $FC_6H_4CH_2NH_2$, $NH_2CH=NH_2I$ and $PbI_2$ in a molar ratio of 0.2:2:1 and a concentration of 10%, after being annealed, a thin film with the new-type perovskite film layer structure is obtained, and a near infrared device is prepared.

Figure 53:
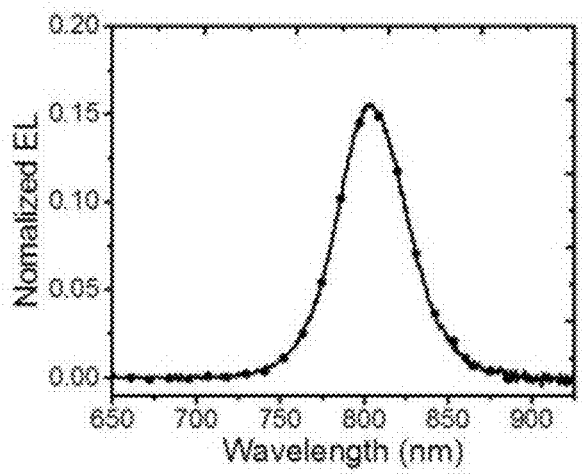
FIG. 53 illustrates an electroluminescence spectrum of the perovskite light-emitting diode in Embodiment 13.
Figure 54:
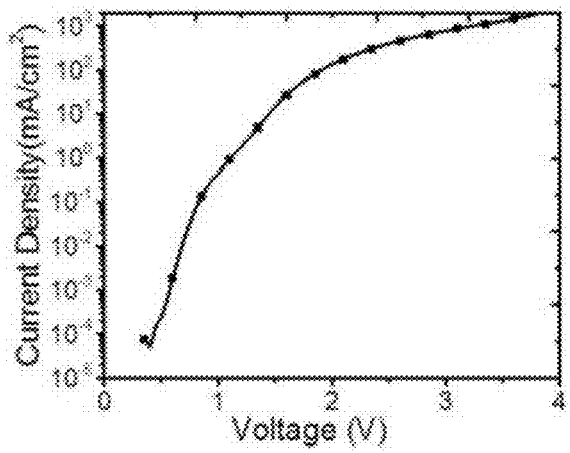
FIG. 54 illustrates the dependence of voltage on current density of the perovskite light-emitting diode in Embodiment 13.
Figure 55:
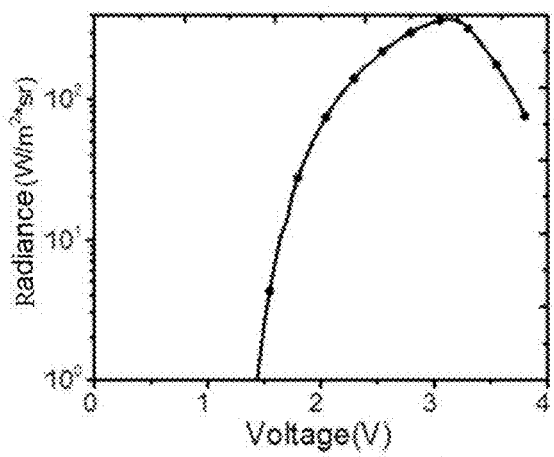
FIG. 55 illustrates the dependence of voltage on radiance of the perovskite light-emitting diode in Embodiment 13.
Figure 56:
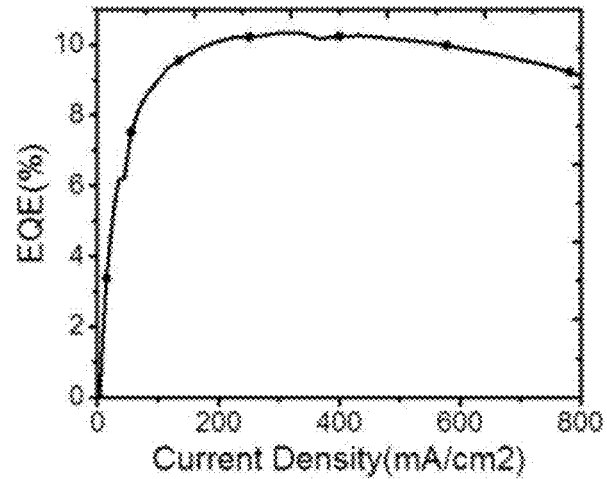
FIG. 56 illustrates the dependence of current density on external quantum efficiency of the perovskite light-emitting diode in Embodiment 13.

FIG. 53 is an electroluminescence spectrum of the near infrared device, and the electroluminescence peak of the device is 803 nm. FIG. 54, FIG. 55 and FIG. 56 are voltage-current density, voltage-radiance, and current density-external quantum efficiency characteristics curve diagrams of the device respectively. The device turns on at a voltage of 1.3 V, and the external quantum efficiency reaches 10.3%.

Embodiment 14: Preparation of Device Based on New-Type Perovskite Film Layer Structure The device adopts the same device structure as in Embodiment 2. By spin-coating on the substrate with precursor solution of $NH_2C_6H_4COOH$, $NH_2CH=NH_2I$ and $PbI_2$ in a molar ratio of 0.8:2:1.2 and a concentration of 10%, after being annealed, a thin film with the new-type perovskite film layer structure is obtained, and a near infrared device is prepared.

Figure 57:
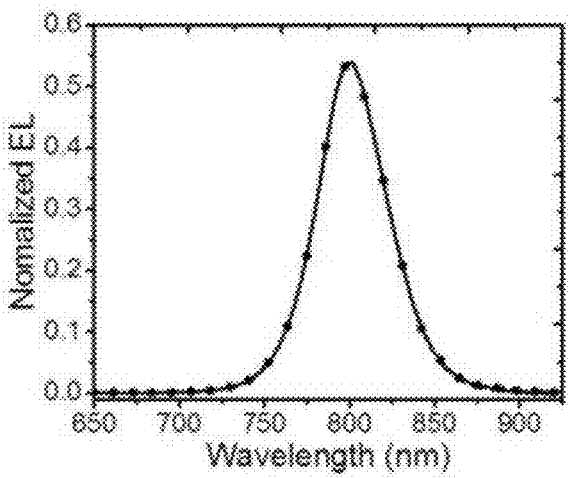
FIG. 57 illustrates an electroluminescence spectrum of the perovskite light-emitting diode in Embodiment 14.
Figure 58:
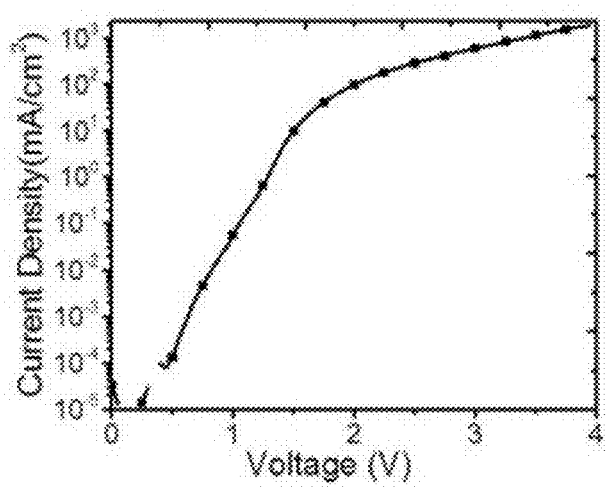
FIG. 58 illustrates the dependence of voltage on current density of the perovskite light-emitting diode in Embodiment 14.
Figure 59:
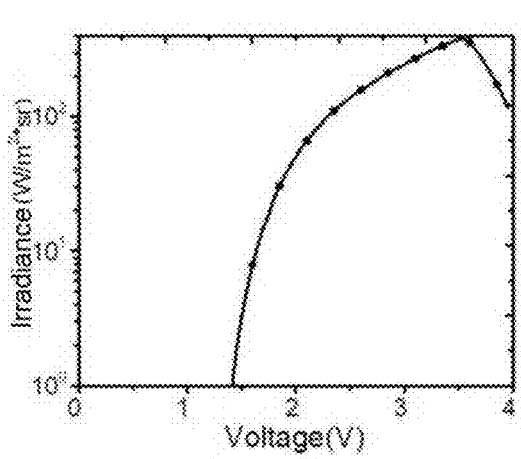
FIG. 59 illustrates the dependence of voltage on radiance of the perovskite light-emitting diode in Embodiment 14.
Figure 60:
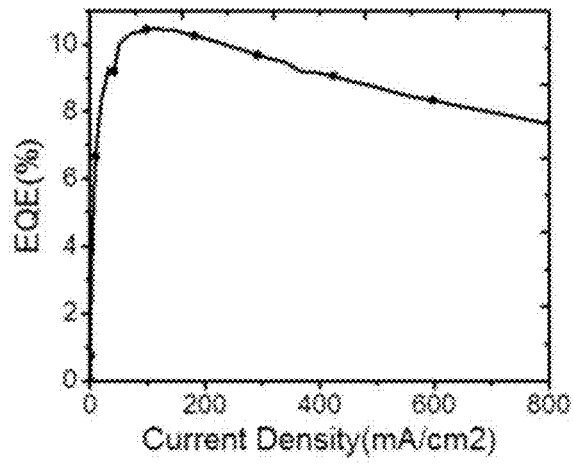
FIG. 60 illustrates the dependence of current density on external quantum efficiency of the perovskite light-emitting diode in Embodiment 14.

FIG. 57 is an electroluminescence spectrum of the near infrared device, and the electroluminescence peak of the device is 800 nm. FIG. 58, FIG. 59 and FIG. 60 are voltage-current density, voltage-radiance, and current density-external quantum efficiency characteristics curve diagrams of the device respectively. The device turns on at a voltage of 1.4 V, and the external quantum efficiency reaches 10.4%.

Embodiment 15: Preparation of Device Based on New-Type Perovskite Film Layer Structure The device adopts the same device structure as in Embodiment 2. By spin-coating on the substrate with precursor solution of $CH_2NH_2C_6H_4COOH$, $NH_2CH=NH_2I$ and $PbI_2$ in a molar ratio of 0.8:2:1.2 and a concentration of 10%, after being annealed, a thin film with the new-type perovskite film layer structure is obtained, and a device is prepared.

Figure 61:
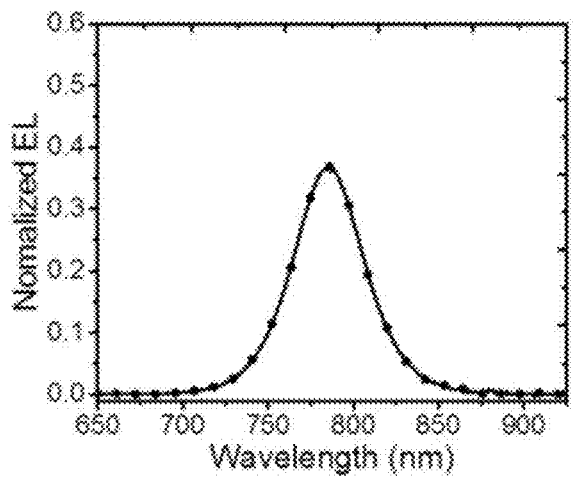
FIG. 61 illustrates an electroluminescence spectrum of the perovskite light-emitting diode in Embodiment 15.
Figure 62:
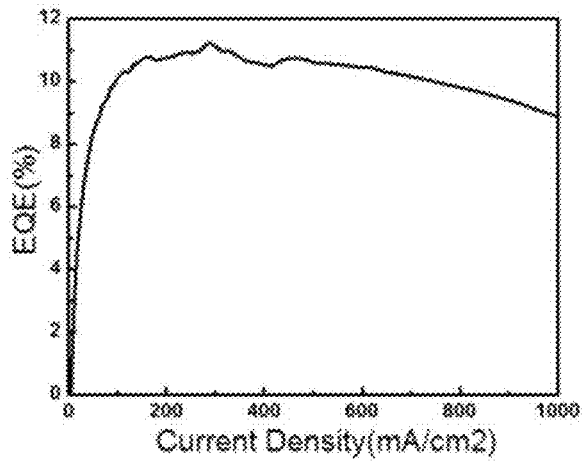
FIG. 62 illustrates the dependence of current density on external quantum efficiency of the perovskite light-emitting diode in Embodiment 15.

FIG. 61 is an electroluminescence spectrum of the near infrared device, and the electroluminescence peak of the device is 786 nm. FIG. 62 is a current density-external quantum efficiency characteristics curve diagram of the device. The external quantum efficiency reaches 11%.

Embodiment 16: Preparation of Device Based on New-Type Perovskite Film Layer Structure The device adopts the same device structure as in Embodiment 2. By spin-coating on the substrate with precursor solution of $NH_2CH=NH_2I$ and $PbI_2$ in a molar ratio of 3.4:1.8 and a concentration of 12%. Because an excess of an alkylammonium salt is added, after being annealed, a structured perovskite film layer is obtained, and a device is prepared.

Figure 63:
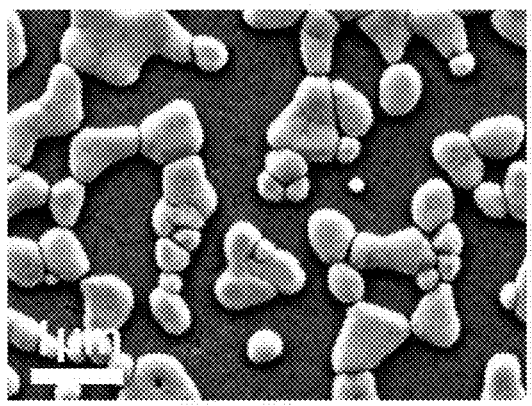
FIG. 63 illustrates a SEM image of a perovskite thin film in Embodiment 16.
Figure 64:
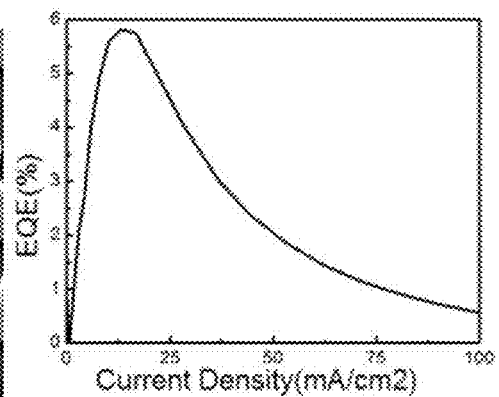
FIG. 64 illustrates the dependence of current density on external quantum efficiency of the perovskite light-emitting diode in Embodiment 16.

FIG. 63 is an SEM image of the thin film, which shows that the perovskite thin film prepared by adding the excess of the alkylammonium salt to the precursor solution is provided with a typical concave-convex structure. FIG. 64 shows a current density-external quantum efficiency curve of the device. The external quantum efficiency reaches 5.8%.

It should be understood that improvements or transformations may be made by those of ordinary skill in the art according to the above disclosure, and all of these improvements and transformations shall fall within a scope of protection of the claims attached to the disclosure.

What is claimed is:

1. A perovskite film layer for effectively improving the efficiency of a light-emitting device, wherein the perovskite film layer consists of a layer with discontinuous, irregularly distributed perovskite crystal grains and an organic insulating layer with a low refractive index, while the organic insulating layer is embedded between the perovskite crystal grains, wherein, the perovskite crystal grains form a plurality of convex portions, and the organic insulating layer forms a plurality of concave portions between the convex portions, a refractive index of the organic insulating layer is lower than a refractive index of a perovskite, so that a part of light trapped in the device can be emitted through a substrate, and the light-outcoupling efficiency of the light-emitting device can be improved, thereby the external quantum efficiency of the light-emitting device is improved.

2. The perovskite film layer as claimed in claim 1, wherein the organic insulating layer is spontaneously formed by adding an excess of an alkylammonium salt and/or an organic molecule with a specific functional group to perovskite precursor solution, and performing a combination or reaction with a substrate thin film.

3. The perovskite film layer as claimed in claim 1, wherein a thickness of the organic insulating layer is between 1 nm and 300 nm.

4. The perovskite film layer as claimed in claim 1, wherein the organic insulating layer may avoid a direct contact between a hole transport layer and an electron transport layer in the light-emitting device.

5. The perovskite film layer as claimed in claim 1, wherein a size of the perovskite crystal grains is between 3 nm and 100 μm.

6. The perovskite film layer as claimed in claim 1, wherein a thickness of the perovskite crystal grains is between 5 nm and 500 nm.

7. The perovskite film layer as claimed in claim 1, wherein the morphology of the perovskite film layer directly affects the morphology of an upper charge transport layer and an electrode, so that it can spontaneously form a concave-convex pleated structure, wherein, the concave-convex pleated structure can further improve the light-outcoupling efficiency of the light-emitting device, thereby the external quantum efficiency of the light-emitting device is improved.

8. A device of the perovskite film layer as claimed in claim 1, wherein the light-emitting device comprises a substrate, an anode, a hole transport layer, the perovskite film layer, an electron transport layer, and a cathode.

9. The device of the perovskite film layer as, claimed in claim 8, wherein the organic insulating layer is spontaneously formed by adding an excess of an alkylammonium salt and/or an organic molecule with a specific functional group to perovskite precursor solution, and performing a combination or reaction with a substrate thin film.

10. The device of the perovskite film layer as claimed in claim 8, wherein a thickness of the organic insulating layer is between 1 nm and 300 nm.

11. The device of the perovskite film layer as claimed in claim 8, wherein the organic insulating layer may avoid a direct contact between a hole transport layer and an electron transport layer in the light-emitting device.

12. The device of the perovskite film layer as claimed in claim 8, wherein a size of the perovskite crystal grains is between 3 nm and 100 μm.

13. The device of the perovskite film layer as claimed in claim 8, wherein a thickness of the perovskite crystal grains is between 5 nm and 500 nm.

14. A preparation method of a perovskite film layer for effectively improving the efficiency of a light-emitting device, wherein an excess of an alkylammonium salt and/or an organic molecule with a specific functional group is added to perovskite precursor solution and perform a combination or reaction with a substrate thin film to form an organic insulating layer, perovskite crystal grains in the film layer form a plurality of convex portions, and the organic insulating layer forms a plurality of concave portions between the convex portions.

15. The preparation method as claimed in claim 14, wherein it is spontaneously formed by adding the excess of the alkylammonium salt and/or the organic molecule with the specific functional group to the perovskite precursor solution and perform the combination or reaction with the substrate thin film, wherein the alkylammonium salt is selected from $CH_3NH_3X$, or $NH_2CHNH_2X$; and the functional group of the organic molecule comprises one or more selected from a group consisting of —X, —$NH_2$, —OH, —COOH, —CN, —NC, —SH, —$PH_2$, —SCN, —CHO, —$SO_3H$, —CH(O)CH, and X is a halogen.

16. The preparation method as claimed in claim 14, wherein the organic molecule is one or more of the following organic molecules:

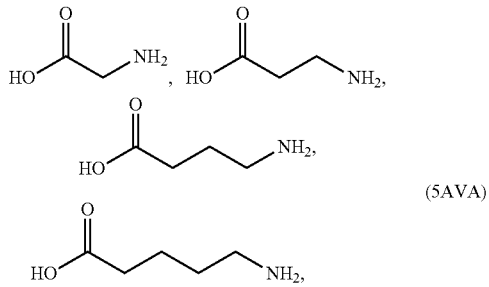

(5AVA)

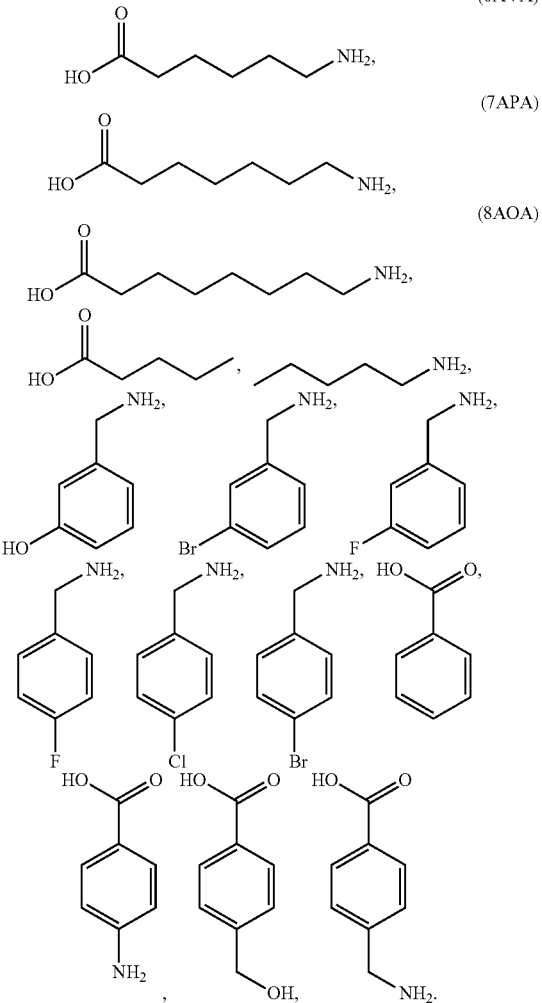

(6AVA)

(7APA)

(8AOA)

17. The preparation method as claimed in claim 14, wherein the substrate thin film is a charge transport layer.

18. The preparation method as claimed in claim 17, wherein the charge transport layer is selected from PEDOT:PSS, PVK, TFB, PFB, Poly-TPD, F8, ZnO, $TiO_x$, $SnO_2$, $NiO_x$ or a multi-layer thin film modified with amino acid organics and polyamine organics.

19. The preparation method as claimed in claim 18, wherein the amino acid organic is any one of 5AVA, 6ACA, 7APA, and 8AOA, and the polyamine organic is any one of PEI, PETE, and PEOz.

20. The preparation method as claimed in claim 14, wherein a structure general formula of the perovskite crystal grains is $ABX_3$, wherein A is a metal cation or the alkylammonium salt cation, which comprises arbitrary one or more selected from $Rb^+$, $Cs^+$, $CH_3NN_3^+$, and $NH_2CHNH_2^+$; B is a divalent metal cation, which comprises one or more selected from $Cu^{2+}$, $Ni^{2+}$, $Co^{2+}$, $Fe^{2+}$, $Mn^{2+}$, $Cr^{2+}$, $Pd^{2+}$, $Cd^{2+}Ge^{2+}$, $Sn^{2+}$, $Pb^{2+}$, $Eu^{2+}$ and $Yb^{2+}$; X is a halogen anion, which comprises one or more selected from $I^-$, $Br^-$, and $Cl^-$; and the perovskite precursor solution is prepared by enabling AX, $BX_2$ and the organic molecule to be dissolved in a solvent in a molar ratio of 1-100:1-100:0-100, and a mass fraction is 1%-50%.

* * * * *